United States Patent
Horan et al.

(10) Patent No.: US 6,704,908 B1
(45) Date of Patent: Mar. 9, 2004

(54) METHOD AND APPARATUS FOR AUTOMATICALLY GENERATING A PHASE LOCK LOOP (PLL)

(75) Inventors: John Horan, Little Island (IE); John Ryan, Rochestown (IE); Ciaran Cahill, Blarney (IE); Steven Dunphy, Portarlington (IE); Mark Smyth, Tramore (IE); Kay Hearne, Bishopstown (IE); Niall O'Donovan, Leap (IE); Tholom Kiely, Wilton (IE)

(73) Assignee: Amadala Limited, Dublin (IE)

( * ) Notice: Subject to any disclaimer, the term of this patent is extended or adjusted under 35 U.S.C. 154(b) by 308 days.

(21) Appl. No.: 09/707,330

(22) Filed: Nov. 6, 2000

Related U.S. Application Data

(60) Provisional application No. 60/166,096, filed on Nov. 17, 1999.

(51) Int. Cl.[7] ................................................. G06F 17/50
(52) U.S. Cl. ................................................. 716/1; 716/12
(58) Field of Search ....................... 716/1–18; 327/147, 327/156; 331/1 R

(56) References Cited

U.S. PATENT DOCUMENTS

| | | | |
|---|---|---|---|
| 5,359,300 A | 10/1994 | Minami | |
| 5,576,647 A | 11/1996 | Sutardja et al. | |
| 5,594,391 A | 1/1997 | Yoshizawa | |
| 5,912,575 A | 6/1999 | Takikawa | |
| 6,184,746 B1 | 2/2001 | Crowley | |
| 6,269,467 B1 * | 7/2001 | Chang et al. | 716/1 |
| 6,504,498 B1 * | 1/2003 | O'Brien | 341/143 |

OTHER PUBLICATIONS

Stephen Mc Donagh, "A Mathematical Model for Charge–Pump Phase–Locked Loops", 6 pages.

* cited by examiner

*Primary Examiner*—Matthew Smith
*Assistant Examiner*—Paul Dinh
(74) *Attorney, Agent, or Firm*—Fenwick & West LLP

(57) ABSTRACT

A method that automatically generates a design for an analog phase lock loop (PLL) core in response to a desired clock frequency.

12 Claims, 16 Drawing Sheets

METHOD AND APPARATUS FOR AUTOMATICALLY GENERATING A PHASE LOCK LOOP (PLL)

This application hereby claims the benefit of a U.S. provisional application filed on Nov. 17, 1999 and given application Ser. No. 60/166,096.

FIELD OF THE INVENTION

The field of invention relates generally to circuit design; and, more specifically, to the automatic generation of PLL related designs.

BACKGROUND

A Phase Lock Loop (PLL) is commonly used to generate one or more clock signals for a digital circuit. FIG. 1 shows a typical PLL design. In FIG. 1, the oscillator 101 is a voltage controlled oscillator (VCO) that produces an output signal having a frequency that is proportional to the voltage placed at its input 101a. The frequency of the oscillator 101 output signal is divided in the feedback loop by the divider 102. The divider 102 is typically a counter that triggers an edge at its output signal only after "N" edges are observed in the VCO 101 output signal. Thus, the divider 102 divides the frequency of the VCO 101 output signal by a factor of "N".

The PLL is used to effectively multiply the frequency of a reference clock by the factor of "N". That is, the PLL may be viewed as having an input that corresponds to a reference clock (Ref_Clock) and an output that corresponds to the VCO 101 output signal. The PLL settles to a stable operating point when the frequency of the VCO 101 output signal is Nfo where fo is the frequency of the reference clock signal.

Phase comparator 103 produces an output based upon the phase difference between the divider 102 output signal and the reference clock signal. In the particular approach shown in FIG. 1, a stream of pulses appear on the "upn" signal if the phase of the divider 102 output signal lags behind the reference clock. The width of the pulses within "upn" pulse stream are proportional to the amount of lag that exists. Similarly, a stream of pulses appear on the "down" signal if the phase of the divider 102 output signal is ahead of (i.e., "leads") the reference clock. The width of the pulses within the "down" pulse stream are proportional to the amount of lead that exists.

If a pulse stream appears on the "upn" signal, pulses of current are supplied by charge pump 104 to the loop filter 105. This raises the voltage at the VCO 101 input because loop filter 105 acts as an integrator. Raising the voltage at the VCO 101 input increases the frequency of the VCO 101 output signal. Similarly, if a pulse stream appears on the "down" signal, pulses of current are pulled by charge pump 104 from the loop filter 105 which lowers the voltage at the VCO 101 input. Lowering the voltage at the VCO 101 input decreases the frequency of the VCO 101 output signal. Note that the PLL should also have adequate phase margin such that phase detector 103 does not confuse the proper output signaling (e.g., sending a "down" signal when the divider 102 output signal actually lags the reference clock).

During an initial synchronization time, the voltage at the VCO 101 input approaches its proper value (i.e., the voltage corresponding to a VCO output frequency of Nfo) as a result of the charge pump's activity. During this time, the charge pump usually supplies and/or pulls current to/from the loop filter 105 in accordance with the aforementioned pulse streams. Eventually, when the VCO 101 input voltage corresponds to a VCO output signal frequency of Nfo, the phase detector 103 does not recognize any error (because the divider output now has a frequency of fo) and the charge pump effectively stops pumping current to/from the charge pump 104. At this point, the PLL is stabilized and the voltage at the VCO 101 input remains substantially constant.

Since the dynamic activity of the charge pump 103 in relation to the design of the loop filter 105 determines the proper voltage at the VCO 101 input, the small signal transfer characteristics of the loop filter 105 are of noteworthy concern in PLL applications. Small signal loop filter 105 transfer characteristics as well as other PLL features (e.g., the design of the VCO 101, etc.) are commonly viewed as belonging to the "analog" domain of semiconductor chip circuit design. That is, a PLL emphasizes an analog as opposed to digital perspective.

Frequently, however, a semiconductor chip (as a whole) is designed substantially from the perspective of the "digital" domain and, as a result, it is common for semiconductor chip designers (i.e., individuals who design a semiconductor chip) to have skills that emphasize or are limited to the digital domain. As a result, semiconductor chip designers commonly experience difficulty while attempting to design a suitable PLL for their semiconductor chip because of a PLL's emphasis on the analog perspective.

SUMMARY OF INVENTION

A method that automatically generates a design for an analog phase lock loop (PLL) core in response to a desired clock frequency.

BRIEF DESCRIPTION OF THE DRAWINGS

The present invention is illustrated by way of example, and not limitation, in the Figures of the accompanying drawings in which.

DETAILED DESCRIPTION

Design Flow Overview

A solution to the problem described in the background is a software program that "automatically" designs a phase lock loop (PLL) for a semiconductor chip designer. As a result, the designer is shielded from comprehending analog concepts associated with PLL design and is allowed to focus his/her efforts on the digital aspects of a chip's design. Semiconductor chips (which are also referred to as integrated circuits (ICs)) are therefore efficiently developed because the time needed by a designer to develop his/her analog design skills (in order to design a PLL) is not expended.

Figure 2:
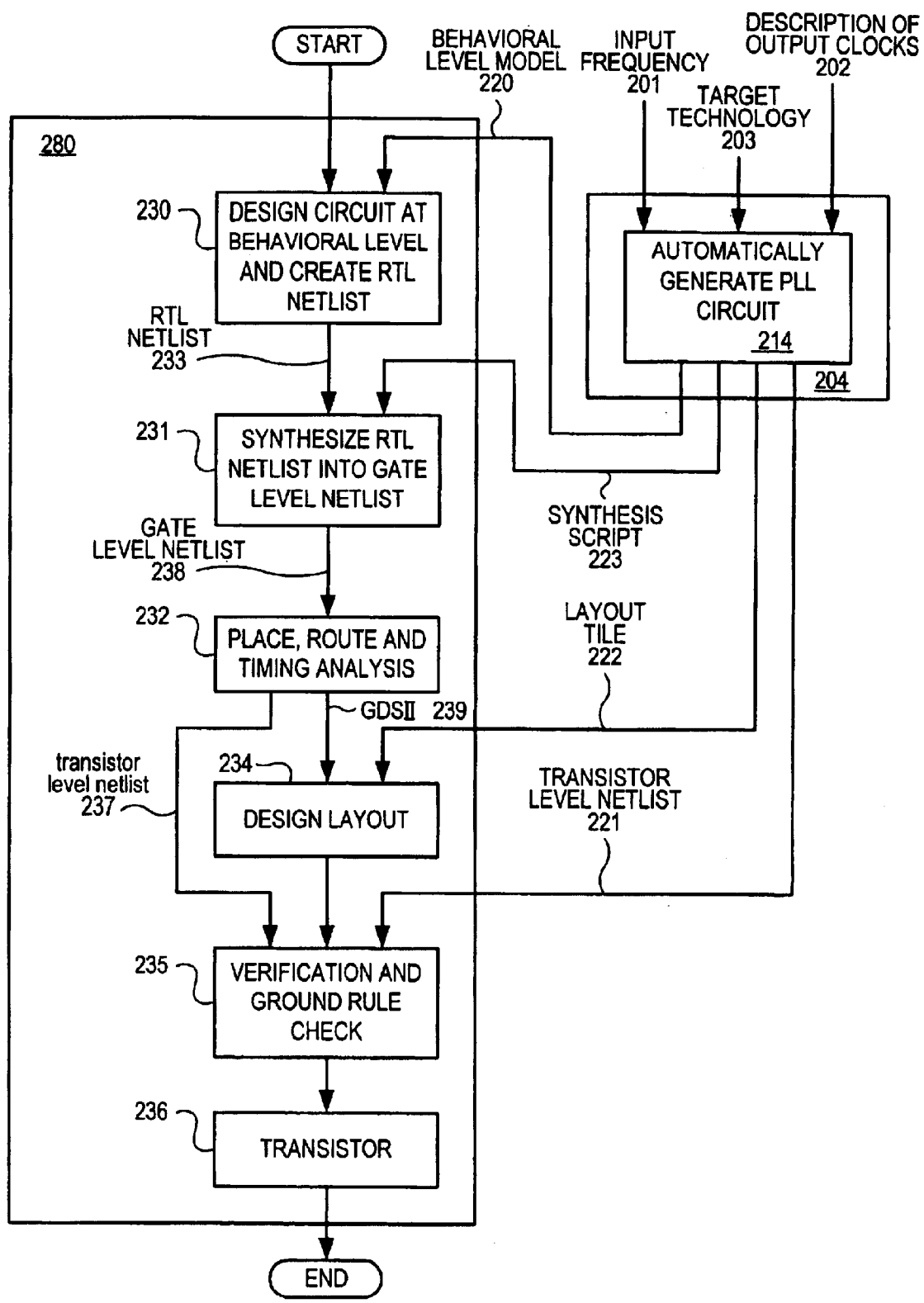
FIG. 2 shows a semiconductor chip design flow that employs an automatically generated PLL circuit.

An exemplary design methodology 200 that employs the use of automatic PLL generation software is shown in FIG. 2. As seen in the example of FIG. 2, the designer presents a desired input frequency 201, a description of the desired output clocks 202 and a desired technology 203 to a PLL generation software program 204. A desired technology 203 (also referred to as a "target" technology) identifies the particular semiconductor manufacturing process that the semiconductor chip will be manufactured with.

The PLL generation software program 204 then generates 214 a PLL related design (e.g., a model, netlist, circuit diagram, etc.) for use by the designer during the development of his/her semiconductor chip. The PLL related design presented by the program 204 may include or exclude various PLL details depending on when it is introduced to the designer during the semiconductor design process. Furthermore, more than one type of PLL representation may be provided by the software program 214 to support the designer at various stages of the design process.

An analog PLL core (which may also be referred to as a "PLL core", an "analog core" and the like) may be generally described as a circuit having a VCO, loop filter and a phase detector, where the VCO and phase detector are communicatively coupled via a feedback arrangement (e.g., via a feedback divider). A PLL circuit may be generally described as a circuit that not only includes at least a representation or model of an analog PLL core but also includes circuitry that provides an input to the analog core (such as a circuit that feeds an input signal to the phase detector) and/or uses an output from the analog core (such as or a circuit that accepts the VCO output signal).

It is important to point out that the automatic PLL generation software may automatically generate an analog PLL core or may automatically generate a PLL circuit or both. Thus, although the following discussion concerns an embodiment where both an analog core and a PLL circuit are automatically generated, it should be understood that aspects of the present discussion apply to PLL generation software that automatically generates only an analog PLL core or only a PLL circuit.

FIG. 2 shows an exemplary semiconductor chip design methodology 200 having automatic PLL circuit generation 214. A standard design flow (i.e., a design flow without the support of an automatically generated PLL) exists within region 280 of FIG. 2 (ignoring inputs to the process 280 as provided by the automatic PLL generation software 204). The automatically generated PLL circuit is integrated into the design of a semiconductor chip at various stages of the semiconductor chip's design process. Note that in the particular example of FIG. 2, the PLL generation software 204 produces four file types for the designer: 1) a behavioral level model 220; 2) a synthesis script 223; 3) a transistor level netlist 221; and 4) a physical layout tile 222. Each of these is discussed in more detail below.

However, before continuing, it should be understood that alternative mechanisms for integrating an automatically generated PLL into a semiconductor chip design process may exist. As such, automatic PLL generation should not be construed as limited to the particular design process flow shown in FIG. 2 or as discussed elsewhere in this description.

To promote efficient semiconductor chip design, a semiconductor chip may be designed 230 at a high level of abstraction (which is commonly referred to as the "behavioral level" or the Hardware Description Language (HDL) level). The behavioral level describes functional building blocks of a semiconductor chip at a high level. As such, a designer can efficiently design 230 a chip by interconnecting various building blocks together.

The operation of the semiconductor chip as a cooperative whole (or one or more portions thereof) may be efficiently observed via simulation. As part of the behavioral level design 230 process, the designer may modify the design (or perhaps the building blocks themselves) in light of these simulations. As seen in the exemplary design flow embodiment 200 of FIG. 2, a behavioral level model 220 is provided to the designer by the PLL generation program 204.

The behavioral level model 220 (which typically takes the form of a Verilog or VHDL compatible model) allows the designer to simulate, at a high level, the operation of his/her chip as it inter-works with (or otherwise depends upon) the operation of the PLL. In an embodiment, which is described in more detail further below, the behavioral level model 220 has an input clock and one or more output clocks having temporal characteristics (e.g., frequency, duty cycle and phase) specified by the designer (e.g., via entry of input parameters 201, 202 to the PLL generation software 204).

The PLL circuit design provided by the PLL generation software 204 may have both analog and digital components. For example, in various embodiments, the PLL circuit design is viewed as having an analog "core" (which corresponds to a basic PLL such as the PLL design shown in FIG. 1) surrounded and/or supported by various digital functional units that add additional features to the functionality provided by the analog PLL core.

For example, digital clock shaping circuitry may be configured to follow the VCO (i.e., accept the VCO 101 output signal as an input) to craft the one or more output clocks 202 specified by the designer. The digital clock shaping circuitry is aptly described in the behavioral model 220 provided by the PLL generation software 204 (e.g., in an RTL HDL format) so that it may be easily formatted into an RTL netlist 233 by standard design flow procedures.

The analog PLL core, however, may be treated as a "black box" at the behavioral level. That is, in the same embodiment referred to above, the analog constituents of the analog core (e.g., the loop filter, VCO, charge pump, phase detector, etc.) are not specifically described at the behavioral level. Rather, the "black box" simply describes the designed for VCO output signal (e.g., by its frequency) and may also describe temporal aspects of the analog core (such as the time consumed to lock onto its input reference clock). More details are provided toward the end of this description of an embodiment of a behavioral level model 220 that corresponds to the approach just described.

Once the designer is satisfied with the behavioral level design, an RTL netlist 233 is created 230 that describes the digital portions of the designer's IC. Note that the behavioral level model 220 provided by the automatic PLL circuit generation software 204 may describe the digital portions of the PLL circuit at the RTL level (e.g., with an RTL netlist). Thus, creating an RTL level netlist that describes the digital portions of the PLL circuit involves simply removing the "black box" that describes the analog PLL core at the behavioral level. A synthesis script 223 may also be provided that allows the digital portions of the PLL circuit to be mapped into layout information (e.g., in GDSII format) and a corresponding transistor level netlist.

After an RTL netlist 233 describing the digital portions of a designer's IC has been created, the RTL level netlist 233 is synthesized into a gate level netlist 238. The gate level netlist 238 is then used to place, route and perform timing analysis 232 of the designer's IC. After the timing has been verified, a transistor netlist 237 is created and the layout 234 of the IC's design may commence.

Layout 234 is a process that defines the position and dimensions of the transistors in an IC (and any interconnections between them). Layout information may be stored in a GDSII file or other type of file that stores physical layout aspects of a semiconductor chip.

As seen in the embodiment 200 of FIG. 2, the automatic PLL generation software 204 further provides the designer with: 1); a layout tile 222 (e.g., a GDS-II file) that describes the layout of an analog PLL core; and 2) a transistor level netlist 221 of the analog PLL core. As such, enough information exists to completely layout 234 the IC.

That is, the transistor level netlist 237 and GDS II information 239 provided by the place, route and timing analysis 232 provides a full description of the digital portions of the IC while the layout tile 222 and transistor level netlist 221 provided by the automatic PLL circuit generation software 204 provides a full description of the analog portions of the IC.

The layout is then verified 235 by comparing (also referred to as "back annotating") the connections of a transistor netlist (that completely describes the analog and digital portions of the IC) with the connections implemented in the layout. When the layout is verified it is then checked against the semiconductor design rules particular to the manufacturing process the chip is to be manufactured with. Masks are then generated 236 and the chip is ready for manufacturing.

Alternate design flow embodiments exist. For example, in another embodiment the designer is provided with a layout tile 222 and transistor level netlist 221 having both digital and analog portions of a PLL circuit described by the behavioral model 220. As such, an RTL netlist and synthesis script 223 need not be provided by the automatic PLL generation software 204.

Automatic PLL Circuit Generation

Figure 3:
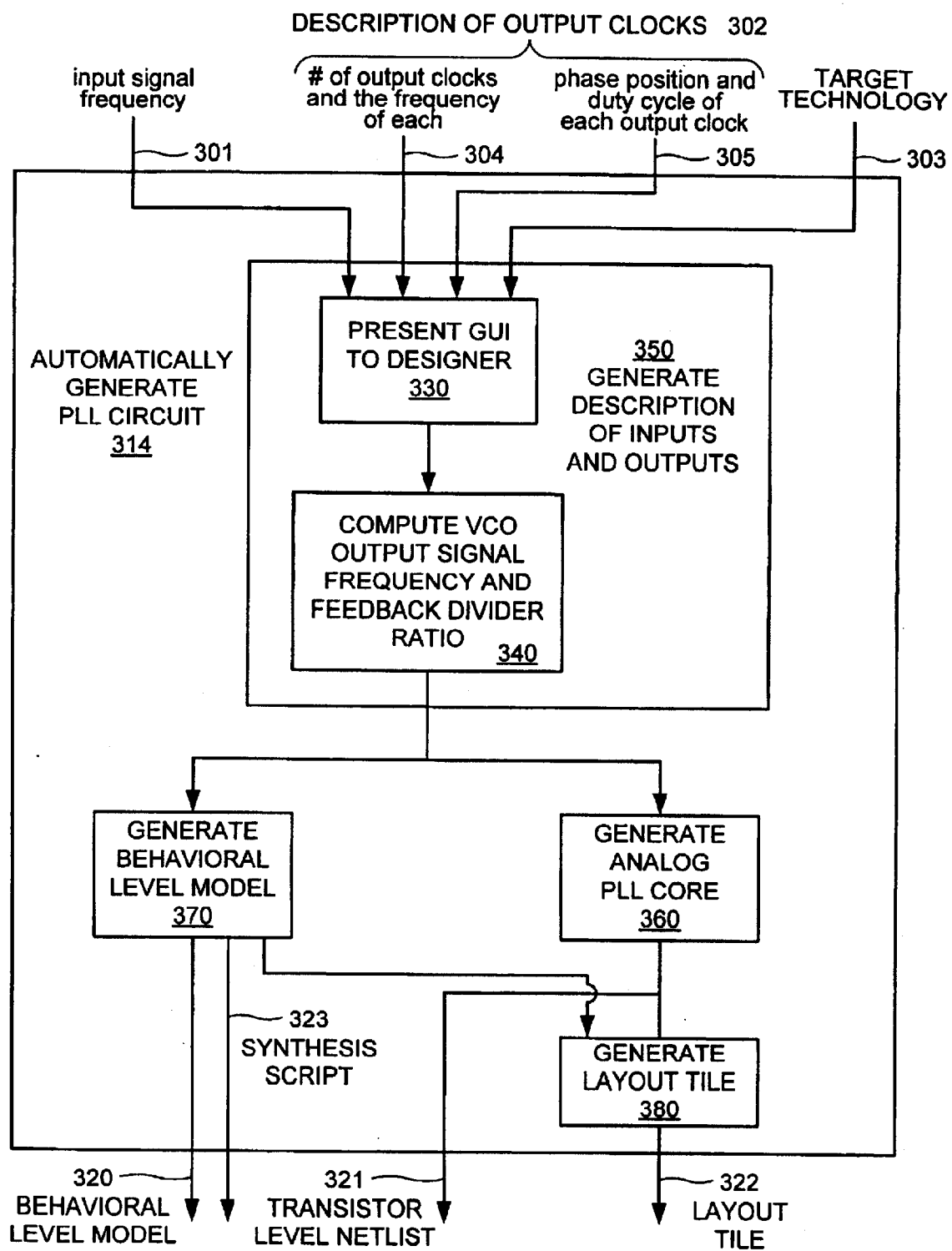
FIG. 3 shows a methodology for automatically generating a PLL circuit.

FIG. 3 shows an exemplary embodiment 314 of a methodology that may be used to automatically generate a PLL circuit 214 as seen in the design flow 200 of FIG. 2. The methodology 314 of FIG. 3: 1) defines 350 the inputs and the outputs of the circuitry to be automatically generated; 2) generates 360 a design for an analog PLL core (the analog core may also be simulated and the results of the simulation presented to the designer); 3) generates 370 a behavioral level model that is used by the designer at the behavioral design level; and 4) generates 380 a physical layout tile of the automatically generated circuit for use by the designer during the layout of the semiconductor chip.

Thus as an example, referring to FIGS. 2 and 3: 1) the behavioral level model 320 of FIG. 3 corresponds to the behavioral model 220 of FIG. 2; 2) the transistor level netlist 321 of FIG. 3 corresponds to the transistor level netlist 221 of FIG. 2 (where the transistor level netlist 221 of FIG. 2 corresponds to the PLL's analog core as described above); and 3) the physical layout tile 322 of FIG. 3 corresponds to the physical layout tile 222 of FIG. 2.

Figure 1:
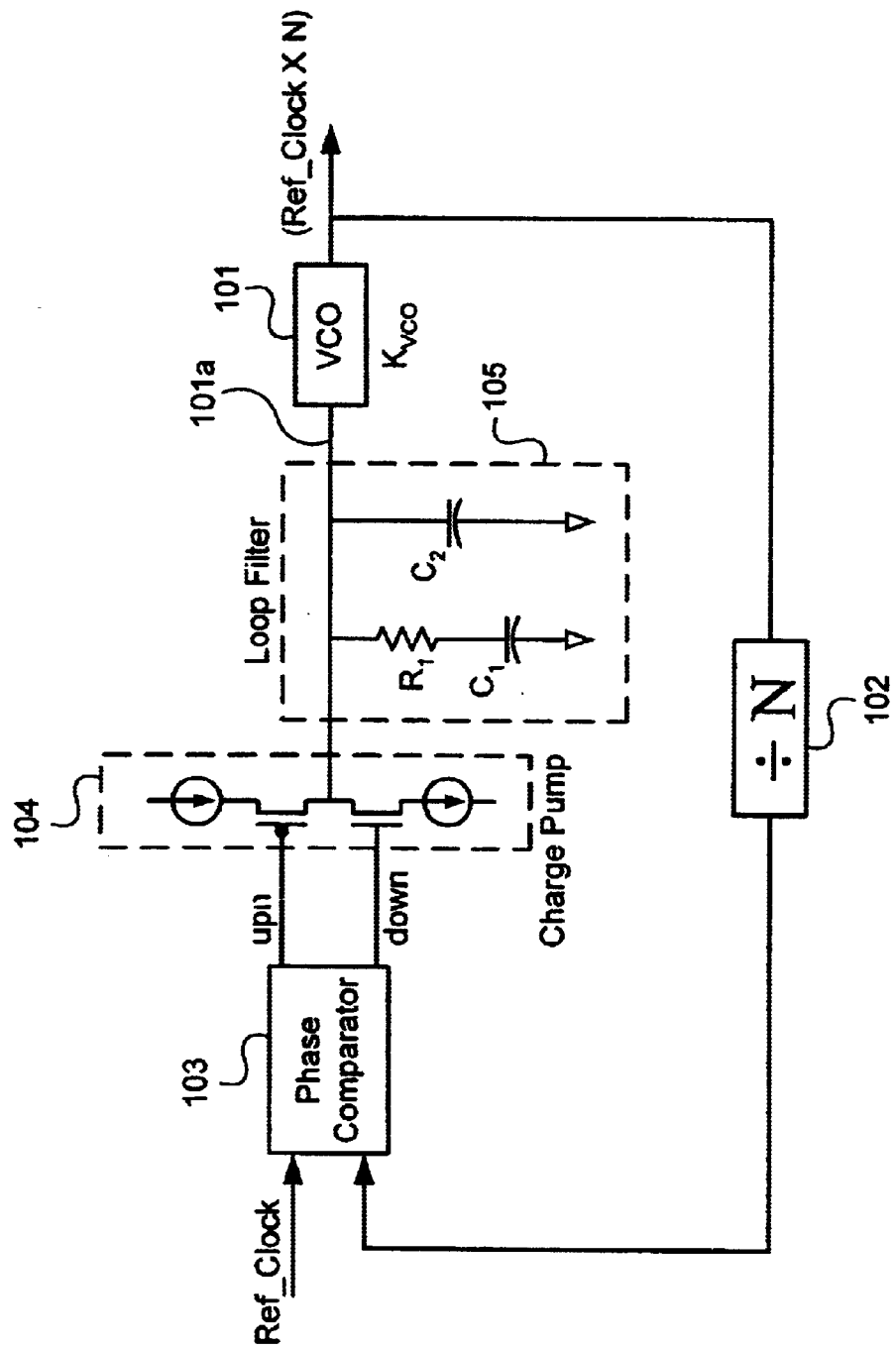
FIG. 1 shows a phase lock loop (PLL)

Note that the inputs and outputs of the circuit to be automatically generated may be defined 350 by: 1) presenting 330 a "clock display" graphical user interface to the designer so that a description 302 of the output clocks to be derived from the VCO output signal may be easily defined (as well as other information such as the input clock frequency 301); and 2) computing 340 the VCO output signal frequency and the division performed by the divider located in the feedback path of the PLL (e.g., divider 102 of FIG. 1).

Figure 4:
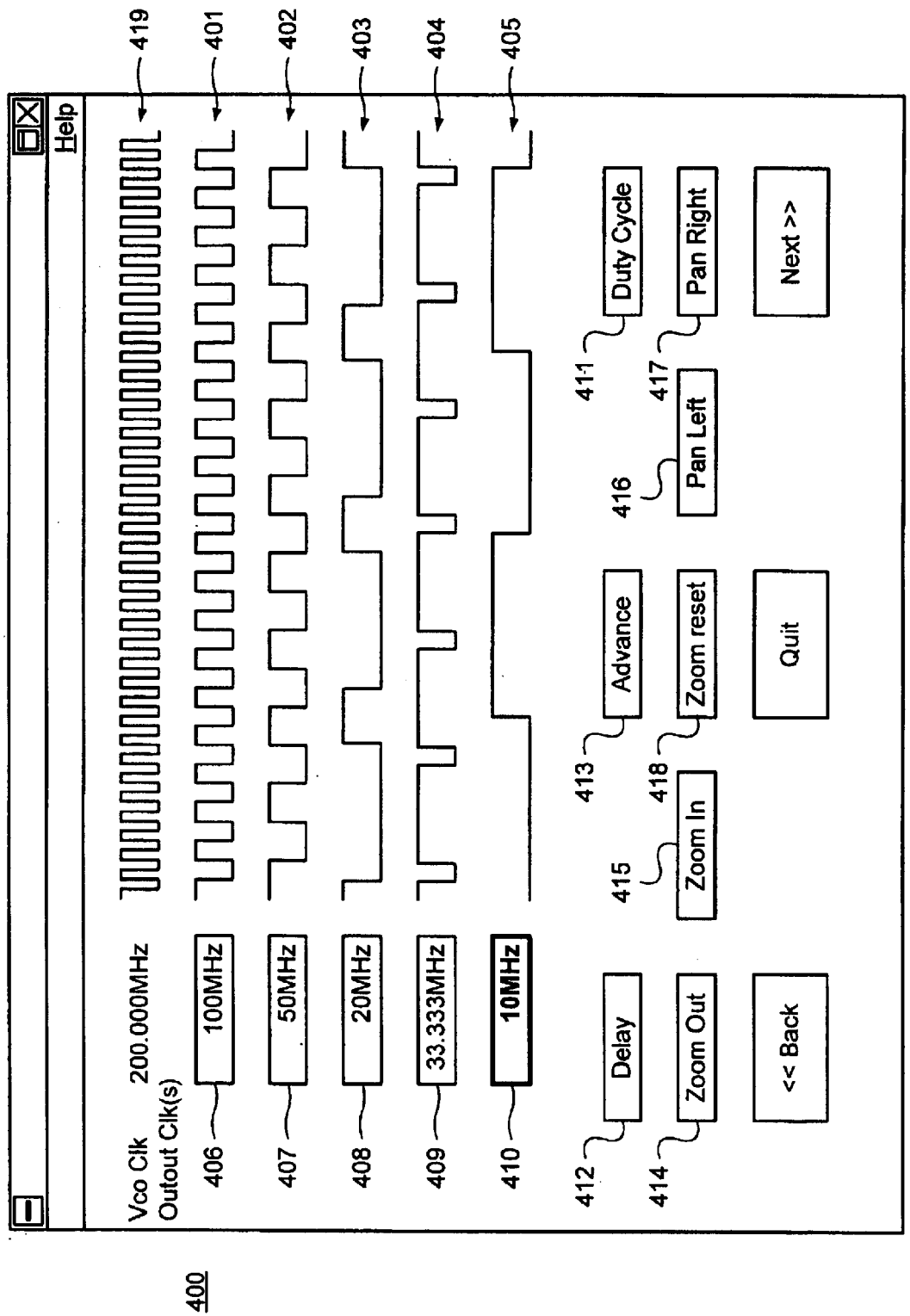
FIG. 4 shows a graphical user interface (GUI) for entering desired clock output signals.

FIG. 4 shows an exemplary graphical user interface 400 that may be presented to the designer. Through the graphical user interface 400, the designer can effectively specify a description of the various output clocks to be produced by the PLL circuit. A clock may be defined by its frequency, duty cycle and phase. In the example shown in FIG. 4, the designer has specified four output clocks, the waveforms of which are shown respectively as waveforms 401 through 405.

In the graphical user interface embodiment of FIG. 4, the designer triggers the addition of a new output clock by a control key, or mouse button click or other affirmative action. The designer then enters the frequency of the output clock into a window. A waveform is next displayed having the frequency specified by the designer. FIG. 4 shows an example of the windows 406 through 410 through which the frequency is specified for each of the four corresponding output clock waveforms 401 through 405. In an alternate embodiment, the user specifies the output clock frequencies before the graphical user interface is presented such that the graphical user interface is limited to defining the duty cycle and phase of an output clock.

After the designer has specified the frequency of an output clock, a duty cycle may be specified for the output clock via the duty cycle button 411. For example, by pointing and clicking on a particular waveform, the corresponding output clock is "highlighted". Thus, when the designer subsequently points and clicks upon the duty cycle button 411, the duty cycle of the highlighted output clock can be adjusted. In an embodiment, another window appears that allows the designer to further specify the highlighted clock's duty cycle. The waveform of the highlighted clock is then altered to reflect the designer's desired duty cycle.

The phase position of a highlighted clock (i.e., the position of the waveform along the time (horizontal) axis) may be adjusted via the delay and advance buttons 412, 413 respectively. By selecting the delay button 412, the waveform is moved backward to provide a relative phase lag. By selecting the advance button 413, the clock waveform is advanced forward to provide a relative phase lead.

Referring briefly back to FIG. 3, note that a description 302 of the output clocks has been provided once: 1) the number of output clocks and the frequency of each has been specified 304; and 2) the phase and duty cycle of each output clock has been specified 305. The input clock frequency 301 for the circuit to be automatically generated may also be entered through the graphical user interface 400.

The graphical user interface 400 embodiment of FIG. 4 also allows the waveforms to be viewed from a number of different visual perspectives via the zoom out button 414 (which increases the temporal (i.e., horizontal) scaling of the waveform images), the zoom in button 415 (which decreases the temporal scaling of the waveform images), the pan left button 416 (which moves the view of the displayed waveforms to the left), and the pan right button 417 (which moves the view of the displayed waveforms to the right). The displayed waveforms 401 though 405 can also be automatically brought back to a default temporal scaling via the zoom reset button 418.

Note that the VCO output signal waveform (referred to in FIG. 4 as the Vco Clk 419) may also be displayed. The output clocks are derived from the VCO output signal. That is, the frequency of the output clocks are achieved by "dividing down" from the frequency of the VCO output signal. For example, referring to FIG. 4, waveform 401 corresponds to dividing down the VCO output signal frequency by a factor of 2.0 (i.e., 200 MHz/2=100 MHz), waveform 402 corresponds to dividing down the VCO output signal by a factor of 4.0 (i.e., 200 MHz/4=50 MHz), etc.

The designer may calculate the proper VCO output signal frequency for his or her application and enter it into the automatic circuit generation software. Alternatively, an algorithm may be executed by the software that determines the proper VCO output signal frequency as a function of the output clock waveforms 401 through 405 that are crafted by the designer.

For example in an algorithm embodiment supported by the waveform display of FIG. 4, the VCO output signal frequency is configured to be twice that of the maximum output clock signal frequency. That is, a VCO output signal frequency "divide down" of 2.0 is always implemented to establish the frequency of the fastest output clock. As such, note that the fastest waveform 401 of FIG. 4 has a frequency of 100 MHz while the VCO output signal has a frequency of 200 MHz.

Depending on the circuitry that crafts the output clock waveforms, the minimum allowable pulse width and the temporal increment for all phase adjustments may be limited to integer multiples of the VCO output clock signal period. For example, for a 200 MHz VCO output clock waveform, pulse widths and/or phase adjustments are limited to increments of 5 ns (i.e., because 1/200 MHz=5 ns). Thus, available pulse widths and/or phase adjustments are limited to 5 ns, 10 ns, 15 ns, 20 ns, etc.

More sophisticated algorithm schemes (as compared to the embodiment described just above) may be employed to automatically determine the VCO output signal frequency. For example, in an alternative embodiment, the VCO output signal frequency is determined by referring to the minimum pulse width, the minimum phase position (i.e., the narrowest time between edges of separate output clocks) and the maximum output clock frequency across all the output clocks specified by the designer.

In this alternative embodiment, the proper VCO output signal frequency corresponds to whichever of these parameters corresponds to the highest frequency. For example, if a designer configures a selection of output clocks that demonstrate (across all of the output clocks) a minimum pulse width of 5 ns, a minimum phase position of 10 ns, and a maximum frequency of 50 Mhz, the minimum pulse width of 3 ns corresponds to the highest frequency (i.e., 1/5 ns=200 MHz; 1/10 ns=100 MHz; and 50 MHz×2=100 MHz). Thus, a VCO output signal frequency of 200 MHz is configured for the PLL.

Again, depending on the circuitry that crafts the output clock waveforms, the minimum allowable pulse width and the temporal increment for all phase adjustments may be limited to integer multiples of the VCO output clock signal period. The automatic circuit generation software may be configured to implement sufficiently sophisticated output clock waveform shaping logic that does not limit the duty cycle and phase position choices, as described above, once the VCO output clock signal has been determined. Thus, the automatic generation software described herein should not be construed as being so limited.

Once the VCO output signal frequency has been determined, the divider ratio of the feedback divider (i.e., divider 102 of FIG. 1) may be calculated. Equation 1 below provides a standard equation for determining the dividing down ratio "N" performed by the feedback divider:

$$N = VCO \text{ output signal frequency/reference clock frequency} \quad \text{Eqn. 1}$$

where reference clock frequency corresponds to the frequency of the Ref_Clock signal shown in FIG. 1. In an embodiment, N is an integer. Thus, the designer understands that the automatically generated PLL circuit is to be limited to a VCO output signal frequency and reference clock frequency combination having an integer ratio relationship with respect to one another.

In a more sophisticated embodiment, fractional N synthesis is employed to modulate the feedback divider such that it divides down the VCO output signal frequency by a non integer. As such, the designer is not limited to a VCO output signal frequency and reference clock frequency combination having an integer ratio relationship with respect to one another.

In a fractional N synthesis approach, the circuitry configured by the automatic circuit generation software may include a sigma delta modulator that is coupled to the feedback divider so as to control its division. More details concerning fractional N synthesis may be found in "Method and Apparatus For A Frequency Synthesizer Having a Compensated Sigma Delta Modulator Output Signal" filed on Sep. 27, 2000, provided U.S. patent application Ser. No. 09/672,178 and assigned to Parthus Technologies PLC of Dublin, Ireland.

Referring to the embodiment of FIG. 3, the input and outputs of the circuit to be automatically constructed have been defined 350 once a graphical user interface has been presented 330 to the designer (and the designer has provided a description 302 of the desired output clocks via the interface) and the VCO output signal frequency and feedback divider ratio have been determined 340.

After the input and outputs have been defined 350, an analog PLL core may be generated 360 and a behavioral level model may be generated 370. As seen in the methodology of FIG. 3, the generation 360 of an analog. PLL core may be embodied in the form of a transistor netlist 320 which is made available to: 1) the designer for the purposes of completing the transistor level netlist of the semiconductor chip; and 2) a subroutine that generates a layout tile 322 that describes the physical layout of the analog PLL core.

Automatic Generation of Analog PLL Core

Figure 5:
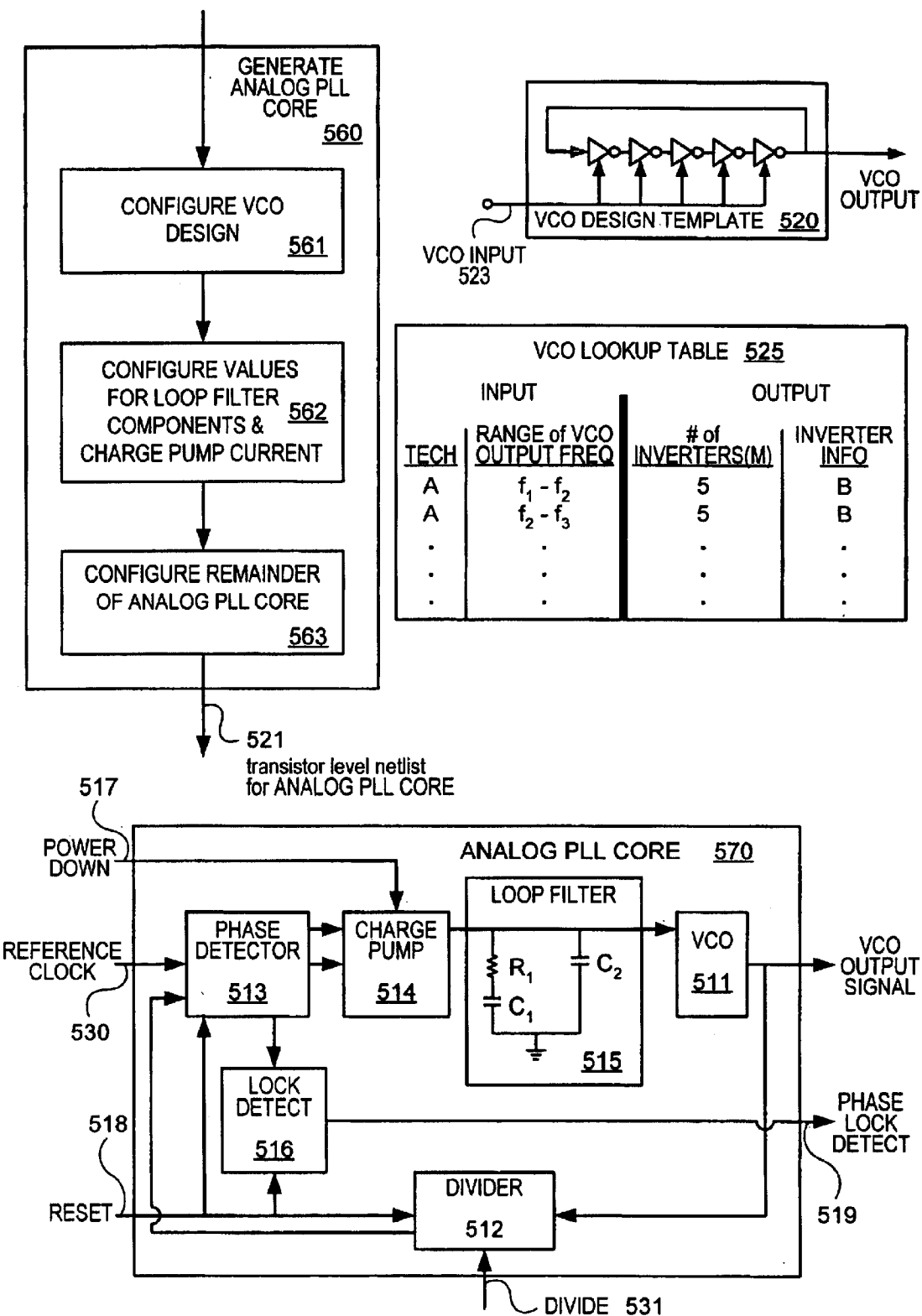
FIG. 5 shows a methodology for automatically generating an analog PLL core.

FIG. 5 shows a methodology 560 that may be used to automatically generate an analog PLL core. That is, the methodology 560 of FIG. 5 may be used to implement the methodology 360 of FIG. 3. Referring to the methodology 560 of FIG. 5 note that: 1) a VCO design is configured 561; 2) values for the loop filter components 562 are determined; and 3) the remaining portions of the PLL are configured 563.

In an embodiment, the PLL to be implemented corresponds to the PLL design 570 shown in FIG. 5. As seen in FIG. 5, the PLL design 570 includes a VCO 511, a feedback divider 512, a phase detector 513 (which may also be referred to as a phase comparator 513), a charge pump 514, a loop filter 515, a lock detect circuit 516, a power down input 517, a reset input 518 and a lock detect 519 output. It is important to point out that other PLL designs may be utilized than the specific PLL design shown in FIG. 5.

The functionality of the VCO 511, feedback divider 512, phase detector 513, charge pump 514, and loop filter 515 have already been described in the background. The lock detect 516 circuit triggers a signal when the phase detector 513 indicates the reference clock input is in phase with the divider 512 output signal. The power down input 517 cuts off power to the charge pump (e.g., to disable the PLL core during a low power mode). The reset input 518 forces the PLL to reacquire phase lock to the reference clock input signal.

The VCO may be configured 561 in light of the technology selection and the VCO output signal frequency that is submitted as an input to the PLL core generation sequence 560. In an embodiment, a "template" VCO design is implemented for all automatically generated designs. An exemplary template VCO design 520 is shown in FIG. 5.

The template VCO design 520 of FIG. 5 includes an odd number of cascaded inverters configured in a feedback arrangement (e.g., as seen in FIG. 5, the last inverter in the cascade drives the first inverter in the cascade). Because an odd number of inverters are employed, the VCO design 520 is logically unstable and continuously oscillates from a 0 to a 1 and from a 1 to a 0.

The frequency of the VCO oscillation is a function of the propagation delay through each inverter and the number of inverters in the cascade. That is, one half of the oscillation period corresponds to one end to end ripple through the cascade of inverters. Thus, the VCO output signal frequency may be expressed as:

$$f_{VCO} = 1/(2Mt_{PD})$$  Eqn. 2 where M is the odd number of inverters employed in the cascade and $t_{PD}$ is the propagation delay through a single inverter.

The propagation delay $t_{PD}$ through each inverter is controlled by the VCO input 523. For example, decreasing the voltage on the VCO input 523 will increase the propagation delay through each inverter while increasing the voltage on the VCO input 523 will decease the propagation delay through each inverter. Thus, increasing the voltage on the VCO input 523 increases the VCO oscillation frequency while decreasing the voltage on VCO input 523 decreases the VCO oscillation frequency.

In an embodiment, the template VCO is designed according to the contents of a look up table 525 that provides the number of inverter stages to use in the cascade ("M" as presented in Equation 2) for the particular technology and VCO output frequency inputs presented to the VCO configuration sequence 561. The contents of the look up table 525 are "filled in" beforehand by those offering the automatic PLL generation software to the designer.

That is, for example, the look up table 525 may be sold as a database (e.g., as stored upon a Compac Disc-Read Only Memory (CD-ROM) or other machine readable medium) that supports the automatic PLL generation software 204 of FIG. 2. The database may be upgraded over time (e.g., by supplying an newer version machine readable medium) to support more technologies (e.g., a newly supported semiconductor manufacturer or a more sophisticated manufacturing process that has been recently introduced).

The details of the look up table 525 are configured to produce a working VCO for a wide range of VCO output signal frequencies and technologies. For example, as described above, in an embodiment the look up table 525 contents indicate the number of inverters M that should be employed. The look up table 525 contents may also further include information that relates to the design of an inverter having an appropriate propagation delay $t_{PD}$ for the technology input, the VCO output signal frequency input and the number of inverters M entry that resides along with such information. The VCO is configured 561 by looking up the number of inverters M and the inverter information for the particular input combination of technology and VCO output signal frequency.

For example, in an embodiment the inverter information is a transistor level netlist that corresponds to the design of an inverter having an appropriate propagation delay (e.g., proximate or equal to $t_{PD}$ in Equation 2). Once the number of inverters M and the inverter design is obtained from the look up table 525, a complete VCO transistor level netlist is constructed having M of the looked up inverter designs arranged according to the structure of the VCO template 520.

The performance of the inverter (and/or the performance of the VCO that is comprised of the inverter) may be simulated, inspected or otherwise qualified beforehand by those responsible for building the contents of the look up table. As a result, proper operation of the VCO is guaranteed before the look up table is actually used to support the automatic generation of designer's PLL.

Note that the look up table may be configured to have unique M and inverter design entries for a range of VCO output signal frequencies (e.g., as seen in look up table 525 of FIG. 5 a first set of entries are listed for a frequency range f1 to f2 and a second set of entries are listed for a frequency range f2 to f3 where f1<f2<f3). Thus, for a particular technology selection, the same VCO design (in terms of the number of inverters M and the design of each inverter) will be constructed over a range of VCO output signal frequencies. This is possible because the VCO input voltage 523 needed to lock onto the reference clock may swing over a range of voltages (which correspond to a range of VCO output frequencies).

In other look up table embodiments, the inverter information may be parameter information (e.g., transistor dimensions, capacitance values, resistance values) that affect propagation delay. A pre-defined inverter template is used to construct (rather than look up) a transistor level netlist that corresponds to an inverter configured according to these parameters. Furthermore, it is important to point out that the VCO template 520 of FIG. 5 is exemplary. As such, other embodiments may employ a template corresponding to another VCO architecture besides a cascade of an odd number of inverters.

Once the VCO design is configured 561, the values for the loop filter 515 components are determined 562. Referring to FIG. 5, the values for the loop filter 515 components include a resistor R1 in series with a capacitor C1. R1 and C1 are both shunted by a capacitor C2. Note that the loop filter 515 example of FIG. 5 corresponds to a $2^{nd}$ order loop. It is important to point out that loop filter designs other than a $2^{nd}$ order loop filter may be implemented according to the design flow described below.

Figure 6:
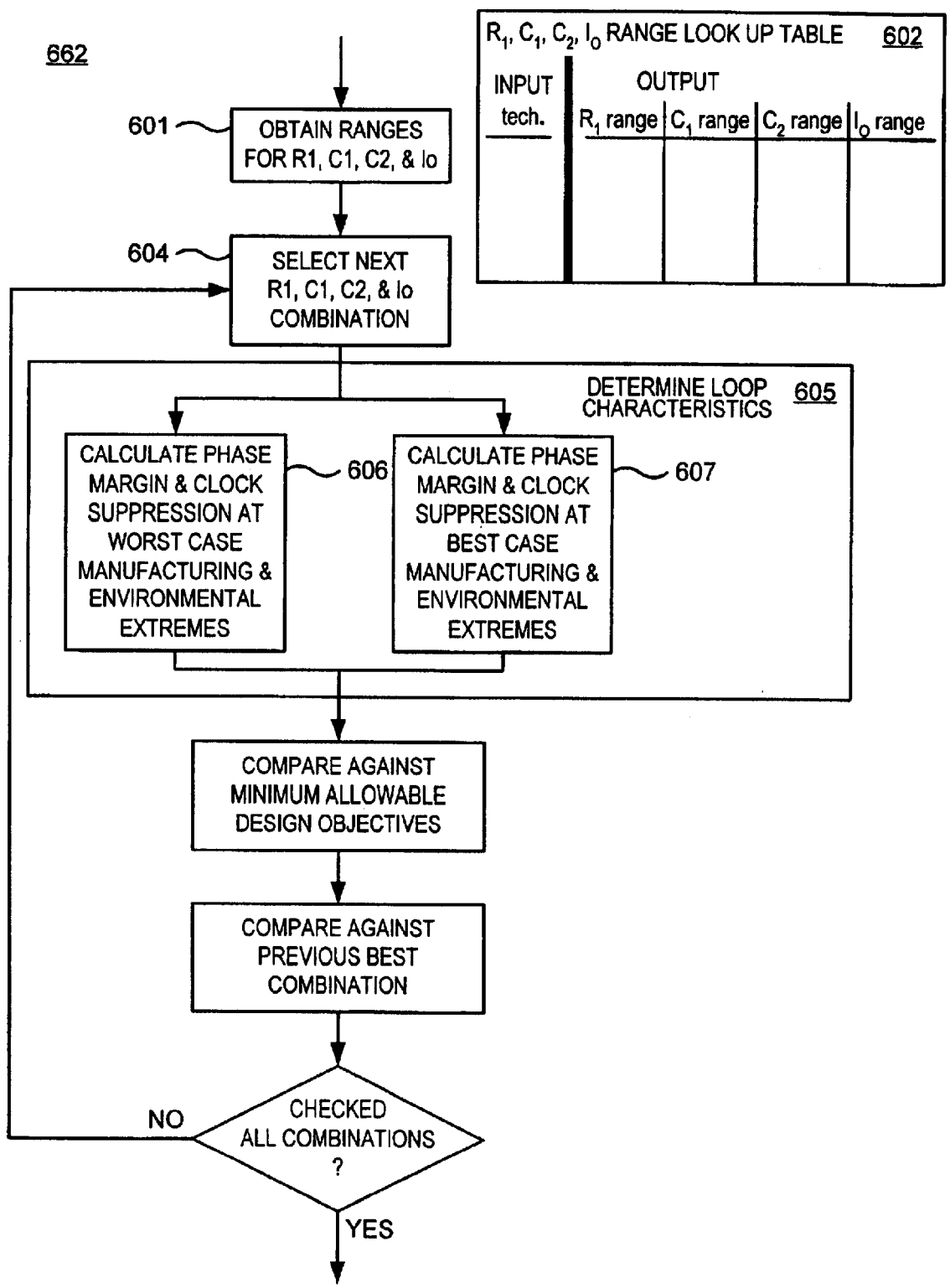
FIG. 6 shows a methodology for automatically generating the values for the loop filter components and the charge pump current of an analog PLL core.

FIG. 6 shows an embodiment of a methodology 662 that may be employed to determine the loop filter components and the charge pump current Io. In the embodiment of FIG. 6, ranges for R1, C1, C2 and Io are obtained 601 from a lookup table 602. In a further embodiment, the ranges provided from the look up table 602 are based upon the designer's technology choice (e.g., technology choice 502 of FIG. 5).

That is, based upon the ohms/square and capacitance/area of a particular semiconductor manufacturing technology (and the impact that such parameters have on the layout or performance of the PLL), a suitable range for each loop filter component (e.g., a range for R1, a range for C1, and a range for C2) and a suitable range for the charge pump current (Io) is determined beforehand by those offering the automatic PLL generation software to the designer.

Note that with some enhancements to the loop filter design 515 shown in FIG. 5, the loop filter components R1, C1 and C2 may be configured to be on chip. Techniques for integrating on chip loop filter components may be found in an application entitled "Method and Apparatus For PLL With Improved Jitter Performance filed on May 17, 2000, provided U.S. patent application Ser. No. 09/574,683 and assigned to the Parthus Technologies,PLC. of Dublin, Ireland. Alternatively, the loop filter components may be configured to be off chip.

Again, the look up table 602 may be sold as a database (e.g., as stored upon a Compac Disc-Read Only Memory (CD-ROM) or other machine readable medium) that supports the automatic PLL generation software 204 of FIG. 2. Furthermore, look up table 602 of FIG. 6 may be merged or otherwise combined with the other look up tables such as look up table 525 of FIG. 5.

Once ranges for R1, C1, C2 and Io have been obtained 601, an iterative process commences that determines a specific value for each of the parameters R1, C1, C2 and Io that are to be used in the analog core of the PLL. Together, these specific values correspond to a loop filter design and a charge pump design (also referred to as loop configuration) that provide "favorable" PLL loop characteristics. Loop characteristics are various indicia that describe the phase and frequency response of the PLL.

In an embodiment, in order to determine the appropriate combination for favorable PLL loop characteristics, all combinations of R1, C1, C2 and Io are tested across their respective ranges (within an incremental resolution for each parameter). The combination having the most favorable loop characteristics are then used for the PLL's analog core.

For example, if R1 has a range from 1 K ohms to 10 K ohms, C1 has a range from 50 pf to 1000 pf, C2 has a range of 1 pf to 50 pf, and Io has a range from 1 uA to 50 uA, for corresponding incremental resolutions of 100 ohms for R1, 10 pF for C1, 1 pF for C2 and 1 uA for Io, there exist 95 different values for R1 (e.g., 1 K, 1.1 K, 1.2 K, etc.), 95 different values for C1, 50 different values for C2 and 50 different values for Io. This corresponds to 22,562,500 different combinations of R1, C1, C2 and Io values (i.e., 95×95×50×50=22,562,500).

In an embodiment of the iterative process mentioned above, one or more aspects the PLL's loop characteristics are calculated for each unique combination of R1, C1, C2 and Io values. In a further embodiment, in order to reduce the number of combinations, C1 may be deemed a function of C2. For example, in an embodiment, C1=kC2 where k is a positive, real number that provides adequate frequency positioning of a pole and a zero associated with the loop filter (e.g., 10<k<30 such as k=20.0).

By correlating each C1 value with a C2 value, the number of combinations is reduced. For example, using the example discussed just above, setting C1=kC2 reduces the number of combinations to 237,500 (i.e., 95×50×50=237,500). As a result, the number of iterations that are performed is reduced and the amount of time consumed in producing the analog PLL core is lessened. Furthermore, note that a separate listing in the look up table 602 for C1 is not necessary because it may be determined from C2.

A detailed embodiment of an iterative process is shown in FIG. 6. In the embodiment shown in FIG. 6, a particular R1, C1, C2, and Io combination is selected 604 and aspects of the PLL's loop characteristics are determined 605. In the particular example of FIG. 6, the loop characteristics to be determined correspond to the phase margin and clock suppression as calculated at variation extremes that are introduced by uncertainties in the selected technology (i.e, the semiconductor manufacturing process).

That is, the value of the resistor R1 and the value of the capacitors C1 and C2 may vary (within some tolerance) from batch to batch of manufactured semiconductor wafers. For example, R1 is guaranteed to be manufactured by the foundry only within R1+/−X where X is the manufacturing tolerance associated with R1. Other manufacturing tolerances may introduce variation into the gain of the VCO and the capacitors C1 and C2. Furthermore, environmental parameters (e.g., temperature) can also exhibit variation that affects the performance of the PLL.

Determining and checking the loop characteristics at the extremes of manufacturing and environmental related tolerances ensures that the analog PLL core will be acceptably functional regardless of the actual parameter value that is manufactured in a particular batch of wafers. As described immediately below, in the particular embodiment 605 shown in FIG. 6, the loop's phase margin and clock suppression are determinations made at extreme ends of these tolerances.

Such determinations may be made because, after a combination of the R1, C1, C2 and Io parameters have been selected, all the information needed to build an understanding of the PLL's loop characteristics are readily available. That is, apart from the parameters mentioned just above, only the VCO transfer function is needed to complete a theoretical basis for determining the loop characteristics of a PLL. As is known in the art, the VCO transfer function may be expressed as $K_{VCO}/s$ where $K_{VCO}$ is the gain of the VCO (expressed in terms of Hz/volt) and s is −j2(pi)f. $K_{VCO}$ and its manufacturing and temperature related uncertainty may be readily determined because the VCO has already been configured beforehand (e.g., during sequence 561 of FIG. 5).

Figure 7:
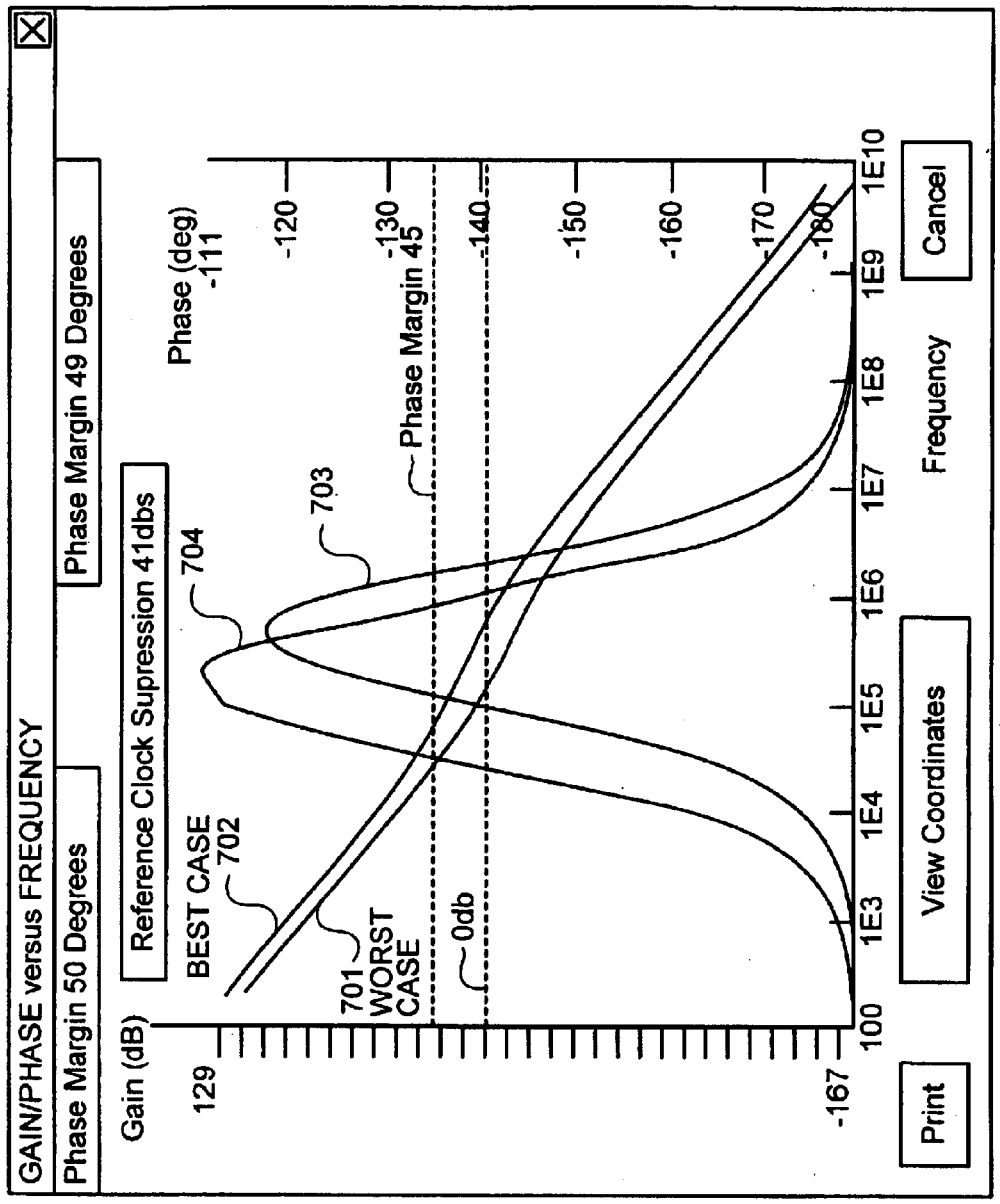
FIG. 7 shows a pair of open loop PLL transfer curves and a pair of PLL open loop phase curves.

Referring to FIG. 7, as an example, note that a pair of open loop PLL transfer functions 701, 702 are displayed. Also shown in FIG. 7 is a corresponding phase curve 703, 704 for each transfer function 701, 702. That is, phase curve 703 corresponds to open loop transfer curve 701 and phase curve 704 corresponds to open loop transfer curve 702.

The first pair of transfer function 701 and phase 703 curves correspond to the PLL's loop characteristics at one extreme of the manufacturing and environmental related variation discussed above while the second pair of transfer function 702 and phase 704 curves correspond to the opposite extreme of the manufacturing and environmental related variation discussed above.

Referring to FIG. 7, the first pair of curves 701, 703 may be referred to as the "worst case" manufacturing and environmental extreme because the transfer curve 701 exhibits reduced gain (causing the PLL to lock onto a reference clock input at a slower rate). Similarly, the second pair of curves 702, 704 may be referred to as the "best case" manufacturing and environmental extreme because the transfer curve 702 exhibits enhanced gain (causing the PLL to lock onto a reference clock input at a faster rate).

In an embodiment, an understanding of the PLL at the worst case extreme is developed with: 1) maximum R1; 2) maximum C2; 3) maximum C1 (which may be expressed as maximum C2 multiplied by k); 4) minimum $K_{VCO}$; 5)maximum temperature; and 6) minimum charge pump current Io. Similarly, an understanding of the PLL at the best case extreme is developed with: 1) minimum R1; 2) minimum C2; 3) minimum C1 (which may be expressed as minimum C2 multiplied by k); 4) maximum $K_{VCO}$; 5) minimum temperature; and 6) maximum charge pump current Io. In an embodiment, the designer is graphically presented with the best case and worst case transfer function 701, 702 and phase curves 703, 704 (as seen in FIG. 7) so that the designer can keep abreast of the PLL's loop characteristics.

Phase margin is the difference between the phase delay through the loop and −180 degrees (i.e., loop phase delay +180) when the loop transfer function exhibits a gain of 0 dB. For example, as seen in FIG. 7, the phase margin for both curves 703, 704 is approximately 50 degrees. Generally, the stability of the loop degrades as the phase margin approaches −180. Thus, when analyzing the manufacturing and environmental extremes, a parameter combination (R1, C1, C2, Io) that produces a phase margin farther away from −180 is deemed "better than" a parameter combination that produces a phase margin closer to −180. Clock suppression, referring briefly back to the PLL model 570 of FIG. 5, is the attenuation through the loop filter 515 suffered by the charge pump 514 output signal at its fundamental frequency.

As seen in the exemplary loop characteristic determination methodology 605 of FIG. 6, the phase margin and clock suppression are determined 606 under the worst case manufacturing and environmental extremes and are determined 607 under the best case manufacturing and environmental extremes. Thus a pair of phase margin values and a pair of clock suppression values are generated.

These are then compared 608 against minimum allowable design objectives (e.g., no worse than −40 dB clock suppression and no worse than −50 degrees phase margin). If the selected combination produces a phase margin or clock suppression that does not meet the minimum allowable design objectives, it is discarded from consideration as a possible combination that may be used.

If the selected combination at least meets the design objectives, the phase margin and clock suppression values of the selected combination are compared 609 against the best phase margin and clock suppression values that have been observed so far from the previously evaluated combinations. If the selected combination has better clock suppression and phase margin values (as compared to the best of the previously evaluated combinations) the previous combination is discarded from consideration as a possible combination that may be used, otherwise, the selected combination is discarded. The iterative process repeats until all the combinations have been evaluated, at which point a netlist 610 for the loop filter may be generated.

Referring back to FIG. 5, once the loop filter 515 components have been configured 562, the VCO netlist and the loop filter netlist are integrated together with transistor level netlists for the remaining functional elements of the PLL (e.g., the feedback divider 518, the lock detect circuit 516, the phase detector 513, and the charge pump 514). These remaining netlists may be retrieved from another database having qualified designs for the selected technology At this point a complete transistor level netlist 521for an analog PLL core has been developed. Note that some more details concerning possible embodiments for the feedback divider are provided in more detail below with respect to FIGS. 11, 12, 13, and 14.

Figure 8:
FIG. 8 shows an embodiment of a simulator input GUI.

After the netlist 521 has been developed, it may be simulated by a simulator. The simulator may be integrated into the automatic PLL circuit generation software 214 of FIG. 2, or a separate simulator may be utilized. FIG. 8 shows an exemplary graphical user interface 800 associated with an integrated simulator. System parameters (i.e., parameters associated with the transistor level netlist of the PLL analog core) are presented in a system parameter field 801. Note that Icp is the same as the charge pump current Io, cs is the same as capacitor C1 and cp is the same as capacitor C2.

Simulation parameters (i.e., parameters that control the simulation environment) are also displayed in the simulation parameter field 802. Filter leakage relates to a filter capacitor's ability to hold charge. Input jitter corresponds to the jitter on the input reference clock to the PLL core. The designer is free to change any of the system or simulation parameters. However, as an initial default, the values corresponding to the automatically generated analog PLL core are presented to the designer in the system parameter field 801 so that it may be simulated.

Figure 9:
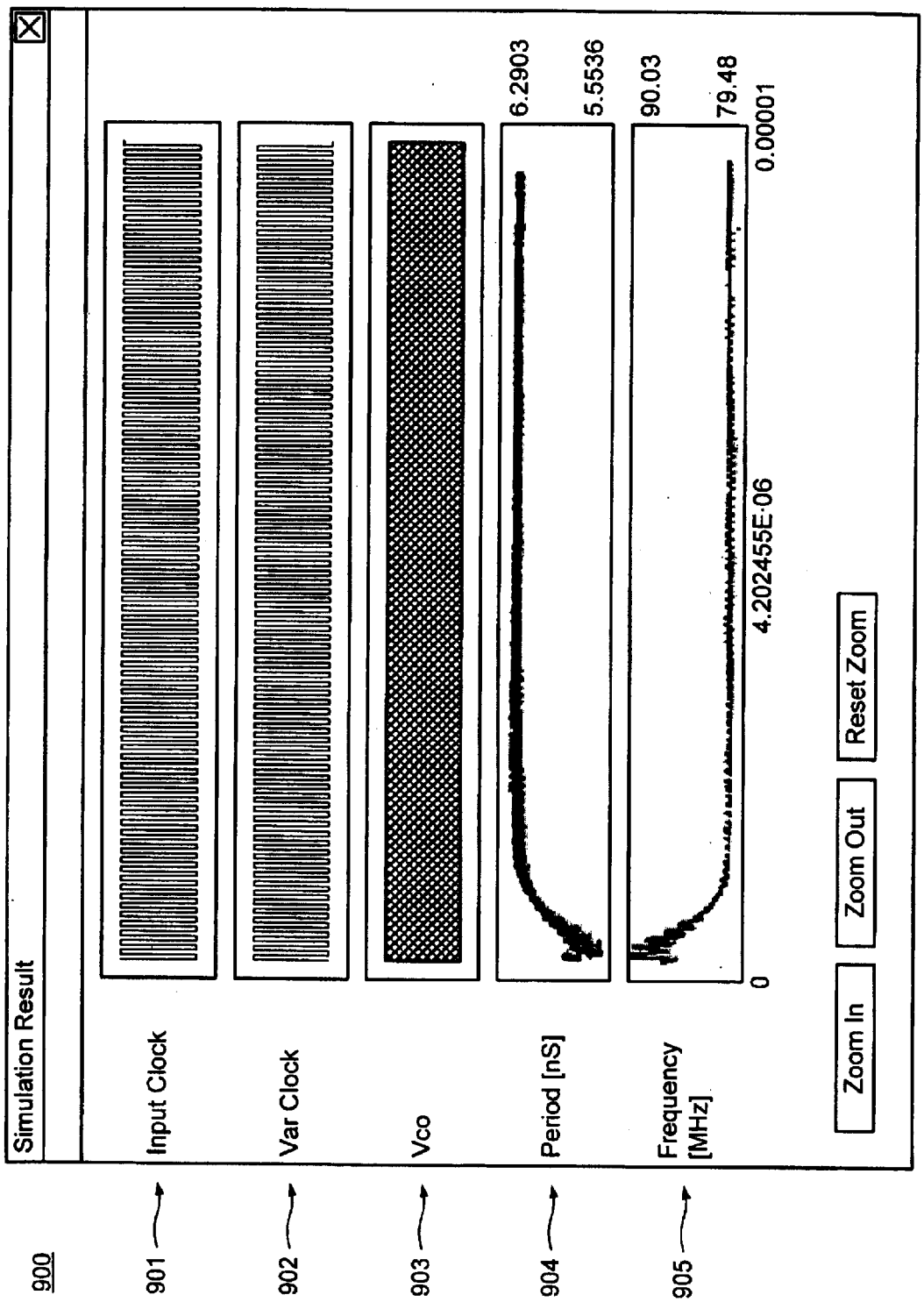
FIG. 9 shows an embodiment of a simulator output.

FIG. 9 shows an exemplary simulation report 900 that is presented to the designer after a simulation is performed. The simulation report 900 includes waveform displays for the input reference clock 901, the feedback divider output 902, and the VCO 903. Graphs of the VCO output signal period 904 and frequency 905 are also displayed. The designer is free to change the design of the analog PLL core (or at least simulate a conceived potential change to its design) via the system parameter interface 801 of FIG. 8.

Automatic Generation of Behavioral Level Model

Recall that FIGS. 5 and 6 related to methodologies that may be used to automatically generate 360 an analog PLL core as seen in the methodology of FIG. 3. The methodology of FIG. 3, however, shows that a behavioral level model and synthesis script may also be generated 370. Behavioral level models were originally discussed with respect to FIG. 2. A corresponding synthesis script for a behavioral level model can be developed by those of ordinary skill.

Recall from the discussion concerning FIG. 2 that the PLL circuit design provided by the PLL generation software 204 may have both analog and digital components. For example, as seen in the exemplary behavioral level embodiment 1020 of FIG. 10, the PLL circuit design is viewed as having an analog PLL core 1070 surrounded and/or supported by various digital functional units that add additional features to the functionality provided by the analog PLL core 1070.

A method for generating a transistor level netlist of an analog PLL core was just described in the preceding section. At the behavioral level, however, the analog PLL core 1070 may be treated as a "black box". That is, the analog constituents of the analog core (e.g., the loop filter, VCO, charge pump, phase detector, etc.) are not specifically described. Rather, the "black box" 1020 simply describes the designed for VCO output signal (e.g., by its frequency) and may also describe temporal aspects of the analog PLL core that have been learned via the simulation of the analog PLL core as described with respect to FIGS. 8 and 9.

For example, note that the analog PLL core described above (i.e., analog core 520 of FIG. 5) possesses a phase lock detect output 519. The phase lock detect output signifies that the PLL has stabilized (i.e., has locked onto the reference clock input 530 signal). As such, it may be used as a soft reset for downstream digital circuitry that depends upon the various output clocks (clock_1, clock_2, etc. as seen in FIG. 10) produced by the PLL circuit 1020.

Figure 10:
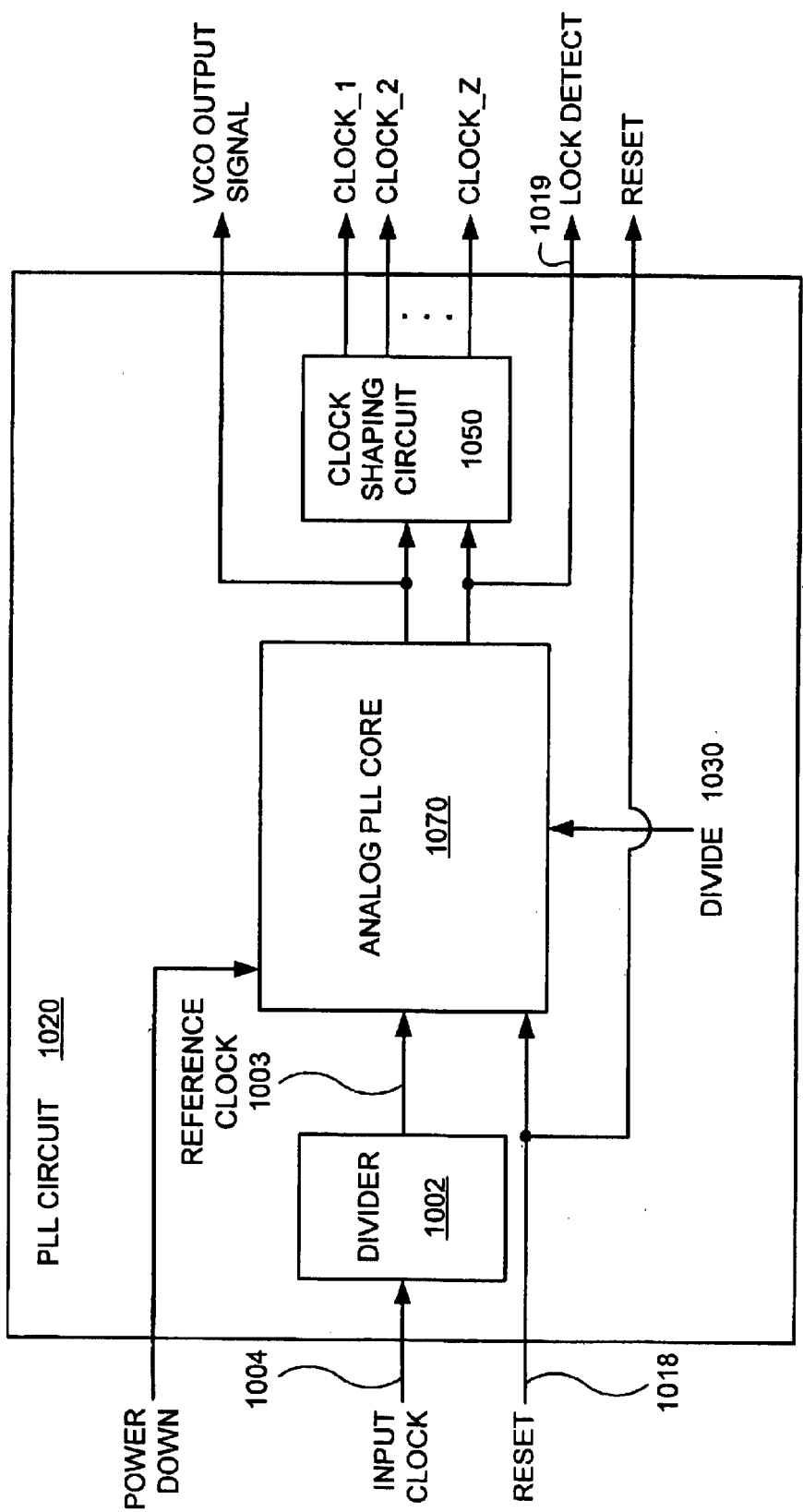
FIG. 10 shows an embodiment of an automatically generated PLL circuit.

Thus, referring to FIG. 10, when the lock detect output 1019 signal changes state to reflect the PLL is locked, downstream circuitry comes out of reset and begins to operate. The timing of the change of state (i.e., how long after a reference clock input 1003 is applied or reset at the reset input 1018 occurs) may be described to correspond to those characteristics demonstrated by the analog core's simulation. Alternate PLL circuit embodiments may include digital circuitry that uses the phase lock output 1019 as well.

Some possible digital circuits that may surround and/or support the operation of the analog core 1020 so as to be described in a behavioral level description of an automatically generated PLL circuit 1020 are also seen in FIG. 10. For example, a divider 1002 may be placed between the reference clock input 1003 that is sent to the analog PLL core 1070 and a clock input 1004 that is actually offered by the designer's circuit.

Inserting a divider 1002 at the input to the PLL (i.e. dividing the input clock 1004 frequency) may be used to increase the range of input to output frequencies available from the PLL circuit. For example, a VCO output signal frequency of 15.0 MHz cannot be achieved with a basic feedback divider 512 (as seen in FIG. 5) and an input clock 1004 frequency of 12.0 MHz. Setting the input divider 1002 ratio to divide the input clock 1004 frequency by 4.0, however, allows a feedback divider ratio of 5.0 to provide the desired setup.

Note also that this allows an automatic analog core routine (such as described with respect to FIGS. 5 and 6) to "force" the use of an input reference clock 1003 signal frequency that is more preferable for proper analog core operation (e.g., in light of feedback division constraints, loop stability oriented design rules, etc.) as compared to the designer's desired input clock 1004 frequency.

Recall from the discussion concerning FIG. 4 that the output clocks to be supplied by a PLL circuit 1020 (e.g., clock_1, clock_2, . . . clock_Z as seen in FIG. 10) may be individually specified (as to the structure of their waveforms) by the designer. Thus, as alluded to in the discussion of FIG. 4, another digital circuit that may be used to support the analog PLL core 1070 is a clock shaping circuit 1050 that crafts designer specified clock waveforms from the VCO output signal.

Figure 11:
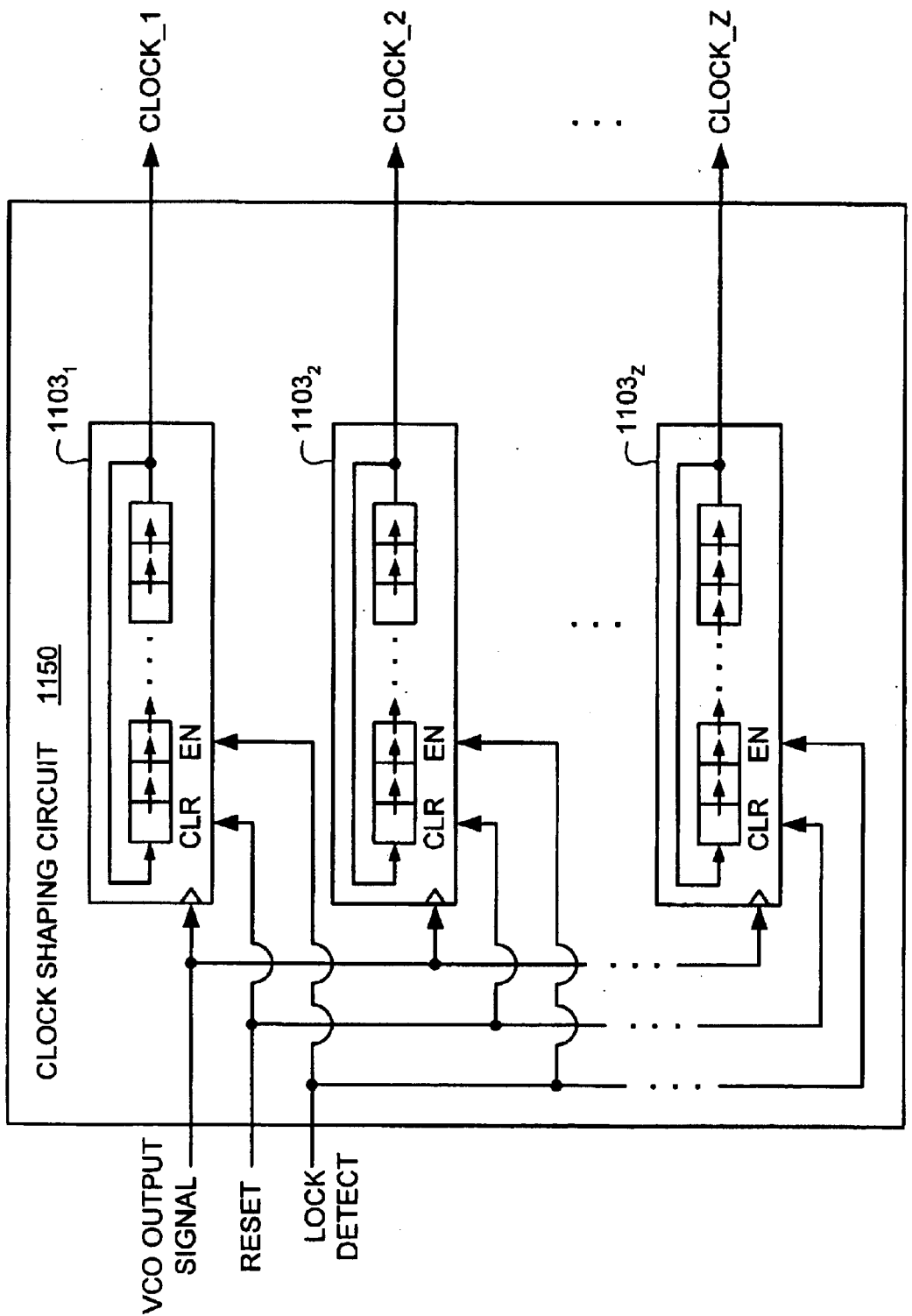
FIG. 11 shows an embodiment of an automatically generated clock shaping circuit associated with the PLL circuit of FIG. 10.

FIG. 11 shows an embodiment 1150 of a design that may be used for the clock shaping circuit 1050 of FIG. 10. It is important to point out, however, that other clock shaping circuits may be used. The clock shaping circuit 1150 of FIG. 11 includes a shift register $1103_1$, $1103_2$, . . . $1103_Z$ coupled in a feedback arrangement (e.g., a last cell 1102 shifts its data to a first cell 1101) for each output clock Clock_1, Clock_2, . . . Clock_Z the designer specifies.

Each shift register $1103_1$, $1103_2$, . . . $1103_Z$, is clocked by the VCO output signal. Thus, within each shift register $1103_1$, $1103_2$, . . . $1103_Z$, a cell will shift data into its neighboring cell at the VCO output signal frequency (e.g., on each rising edge or each falling edge of the VCO output signal). During an initial setup time (e.g., during power up) the patterns of each clock waveform are loaded into the cells of its corresponding shift register. After the setup, each shift register clocks out its cell data and the proper clock waveform appears on the clock output. The proper clock waveform is continuously clocked out because of the feedback arrangement discussed above.

Figure 12:
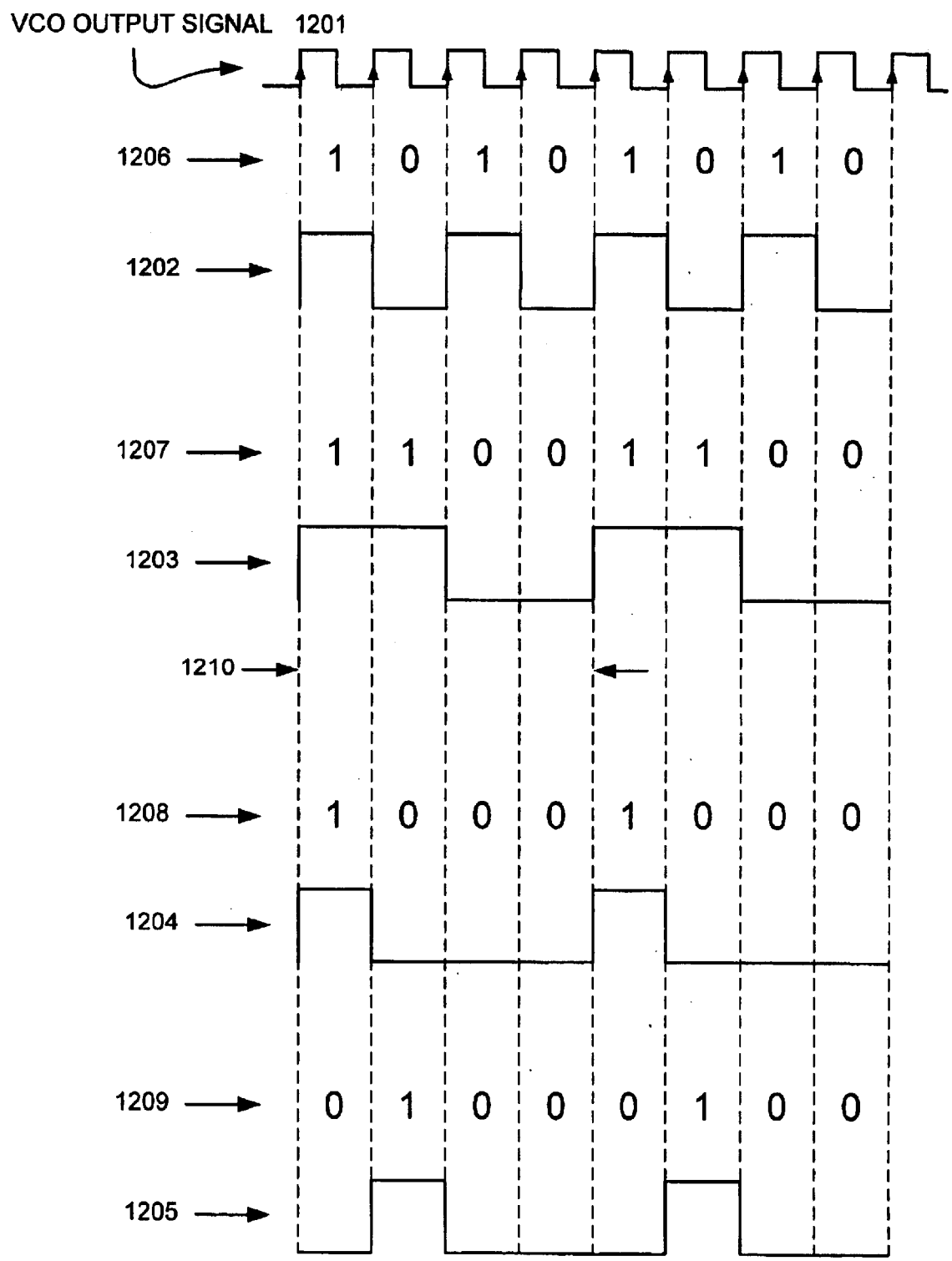
FIG. 12 shows examples of waveforms that may be produced with the clock shaping circuit of FIG. 11.

FIG. 12 demonstrates some examples of how a shift register may be loaded with information in order to craft an output clock having a desired waveform. A VCO output signal 1201 (used as a clocking source) and four clock waveforms 1202, 1203, 1204, 1205 are shown. For simplicity, the shift registers (not shown in FIG. 12) used to produce the output waveforms 1202, 1203, 1204, 1205 are 8 bit registers. Thus, the loaded data 1206, 1207, 1208, 1209 for each waveform in FIG. 12 is shown as eight bits.

A first example shows a "divide by 2" clock waveform 1202 that is generated from its corresponding shift register data 1205. The combination of loading a 10101010 pattern and clocking it out with the VCO output clock produces a 50% duty cycle signal having a frequency equal to one half of the VCO output clock frequency. In the second example, a "divide by 4" clock waveform 1203 is generated from its corresponding shift register data 1207. The combination of loading a 11001100 pattern and clocking it out with the VCO output clock produces a 50% duty cycle signal having a frequency equal to one fourth of the VCO output clock frequency.

The third example shows a "divide by 4" clock waveform 1204 having a 25% duty cycle that is generated from its corresponding shift register data 1208. The combination of loading a 10001000 pattern and clocking it out with the VCO output clock produces a 25% duty cycle signal having a frequency equal to one fourth of the VCO output clock frequency.

The fourth example shows a "divide by 4" clock waveform 1205 having a 25% duty cycle positioned at a phase offset of once VCO clock cycle with respect to the other clocks is generated from its corresponding shift register data 1209. The combination of loading a 01000100 pattern and clocking it out with the VCO output clock produces a 25% duty cycle with a phase offset of one VCO clock cycles having a frequency equal to one fourth of the VCO output clock frequency.

From these examples it can be seen that the frequency of an output clock may be established with the bit spacing (e.g., bit spacing 1210) between neighboring "0 to 1" transitions. It can also be seen that the duty cycle of an output clock may be established by controlling the "density of 1s" within the aforementioned bit spacing 1210 that establishes the clock's frequency. For example, within the bit spacing 1210 of waveform 1203 half or the bits are set at 1 (i.e., a 50% 1's density). This corresponds to a duty cycle of 50%. By comparison, within the bit spacing 1210 of waveform 1204 one fourth of the bits are set at 1 (i.e., a 25% 1's density). This corresponds to a 25% duty cycle.

Furthermore, from these examples it can also be seen that the phase of an output clock may be adjusted by effectively "shifting" a data pattern having the proper frequency and duty cycle before it is actually loaded into the shift register. That is, the data pattern 1209 is the same data pattern as data pattern 1208, except that data pattern 1209 is loaded into the shift register "as if" it has already been shifted by one cell.

Figure 13:
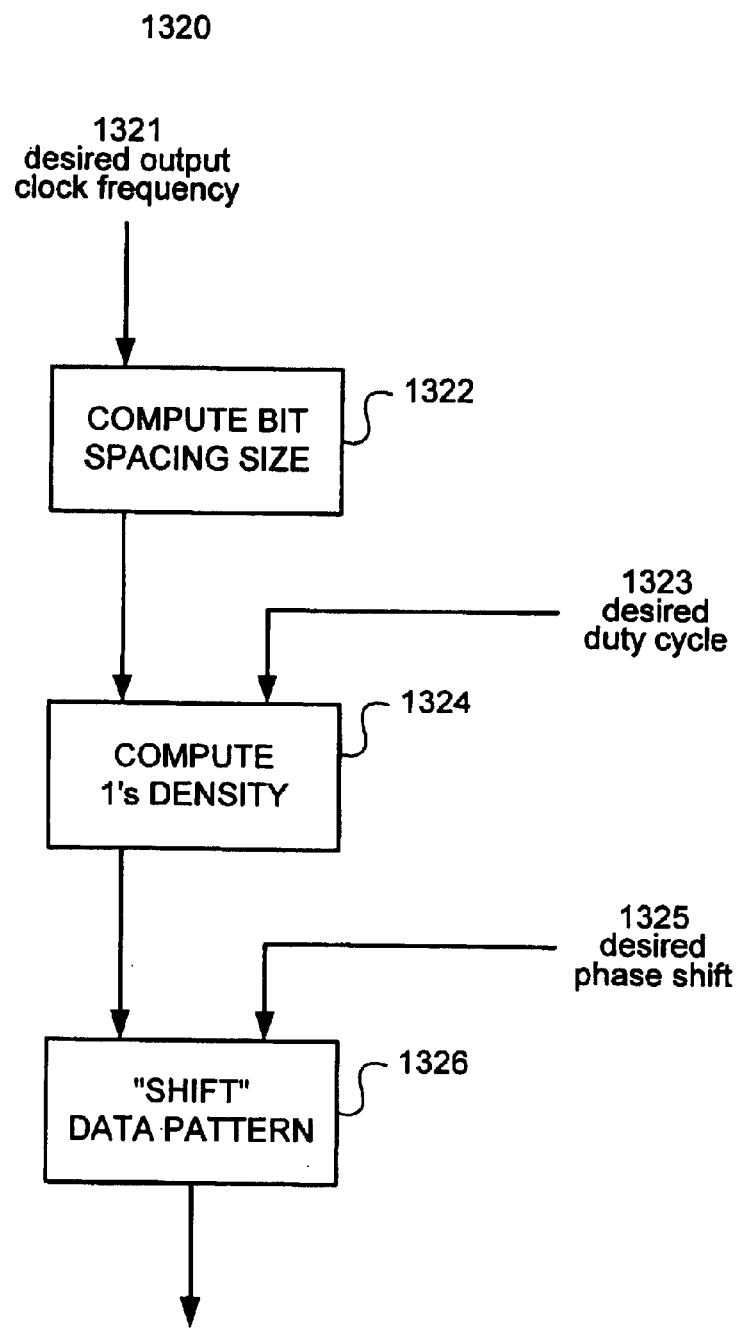
FIG. 13 shows a methodology that may be used to automatically generate the clock shaping circuit of FIG. 11.

A methodology designed consistently with the above observations may be used to translate a designer's desired clock waveform (e.g., as entered through a graphical user interface such as the graphical user interface 400 seen in FIG. 4) into data that is loaded into a shift register responsible for producing the desired clock waveform. An example of such a methodology 1320 is shown in FIG. 13.

First, the designer's desired frequency 1321 is translated 1322 into a number of bit spacings that are forcibly inserted between "0 to 1" transitions of the shift register data pattern. The designer's desired duty cycle 1323 is then translated 1324 into the appropriate "1's density" for each bit spacing within the data pattern. Finally, the designer's desired phase shift 1325 is translated 1326 by reforming the data pattern to look as if was already shifted within the shift register.

Note the size of a shift register controls the frequency division that may be implemented with an output clock. For example a 32 bit shift register allows for frequency divisions of 2, 4, 8, or 16. Similarly, a 24 bit register allows for frequency divisions of 3, 6 and 12; a 20 bit register allows for frequency divisions of 5 and 10; a 14 bit register allows for frequency division by 7; and an 18 bit register allows for frequency division by 9. Together, at least one of these registers allows for any integer frequency division from 2 through 10.

The clock shaping circuit of FIG. 11 and the methodology of FIG. 1320 may be tailored to employ an appropriately sized shift register and data pattern size depending on the frequency division desired by the designer.

Referring back to FIG. 10, notice the presence of divide input 1030 (which corresponds to divide input 530 of FIG. 5). The divide input 1030 may be applicable depending on the design of the divider used in the analog PLL core. In some embodiments the divider may be an integer divider that is completely configured during the analog core generation sequence. As such a divide input 1030 is not necessary.

In other cases, the appropriate feedback division may be externally indicated to the analog core 1020 via a digital circuit (not shown in FIG. 10) that drives the division input 1030. For example, as mentioned above, a sigma delta modulator circuit may be configured to drive the division input 1030 to provide for non integer division in the feedback loop. The sigma delta modulator circuit may be provided by the designer or the automatic PLL generation software. As another example, the appropriate integer division may be indicated by a digital circuit that drives the division input 1030.

Figure 14:
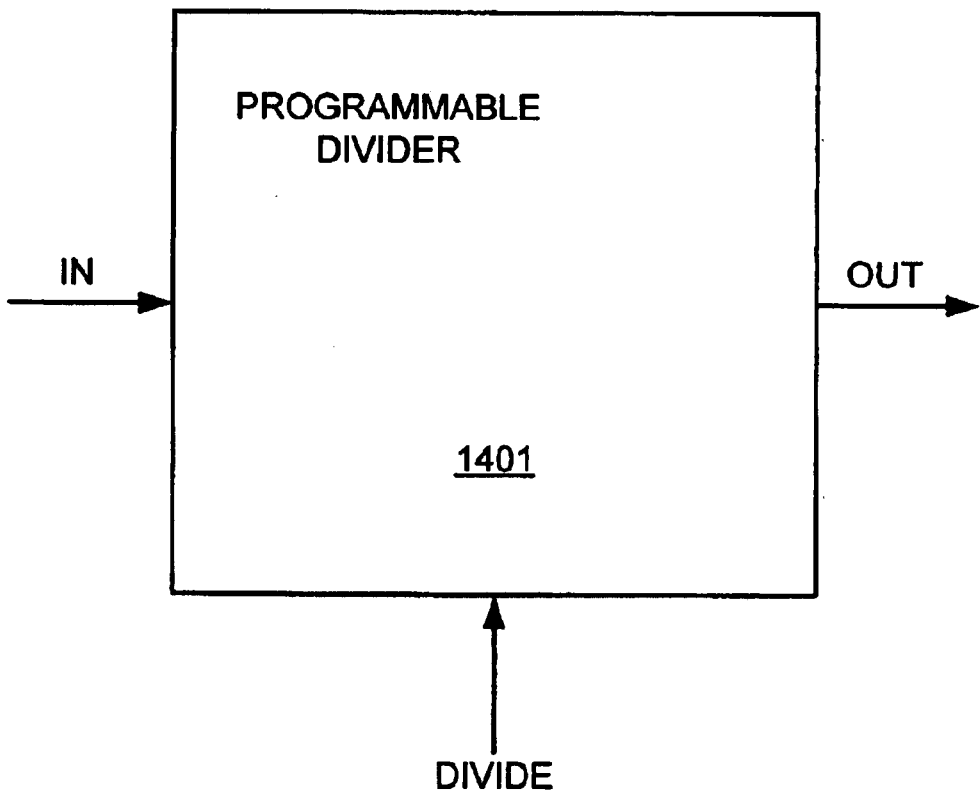
FIG. 14 shows an embodiment of a programmable divider.

FIG. 14 shows a divider embodiment 1401 that may be employed to perform frequency division. The divider embodiment 1401 of FIG. 14 is commonly referred to as a programmable divider. A programmable divider may be used: 1) to feed a pattern generator within the clock shaping circuit 1050 of the PLL circuit of FIG. 10 (e.g., to craft the proper frequencies of the pattern generator's output clocks); 2) as the divider 1002 between the input clock and the reference clock of the PLL circuit of FIG. 10; and/or 3) as the feedback divider within the analog PLL core (e.g., such as divider 512 of FIG. 5).

Programmable dividers are known in the art. A programmable divider is provided with an input word (e.g., at the "divide" input as seen in FIG. 14) that controls the division performed by the divider. The use of programmable dividers (within either an analog PLL core or a PLL circuit) may reduce the complexity of an automatic PLL generation software program. That is, because the software can configure the proper division simply by specifying what it should be (via the divide word input), the complexity of the coding of an automatic PLL generation software program may be reduced.

Automatic Generation of Layout Tile

Referring back to FIG. 3, note that layout information (e.g., in the form of a layout tile 322) may be provided to the designer as another output of an automatic PLL generation software tool. In an embodiment, a layout tile 322 is generated 380 of a PLL circuit.

Figure 15:
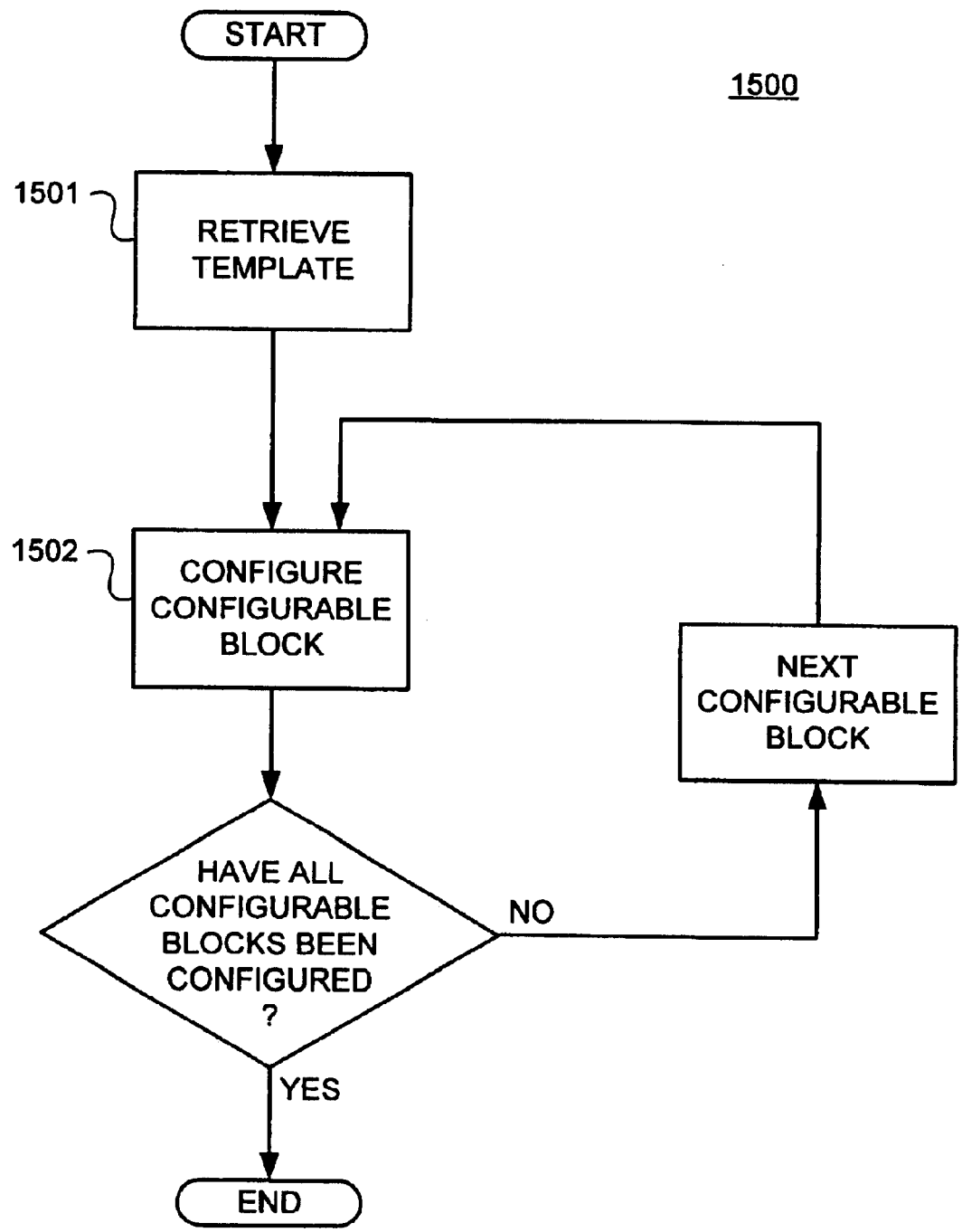
FIG. 15 shows an embodiment of a methodology that may be used to automatically generate a layout for a PLL.

FIG. 15 shows a methodology that may be used to automatically implement the layout of an analog PLL core or a PLL circuit. A physical layout template corresponding to an analog PLL core is first retrieved 1501 from a database (e.g., as a stored on a CD-ROM or other machine readable medium) used to support the automatic PLL generation software program. The analog PLL core 550 shown in FIG. 5 may be used to represent the template for an analog core. The analog core template 550 is an amount of semiconductor surface area having a block (also referred to an component block) for each of the various PLL core components (e.g., the VCO, the divider, the phase detector, the lock detect, the charge pump, and the loop filter).

A block is the layout information of a particular component positioned at its proper place in the template 550. For example, a VCO block 511 having the layout information of the VCO is located in the proper location for a VCO in a PLL core design.

The template with its blocks may be implemented in a GDS-II format. Note that the template 550 also possesses the interconnections between the components (e.g., a trace running between the loop filter and the VCO). Correspondingly, the blocks are configured with input and output traces that line up with the template's interconnection lines (e.g., a VCO block is configured with an input trace that lines up with the aforementioned template trace between the loop filter to the VCO).

Blocks may be static or configurable. Static blocks are not altered during the layout sequence. The complete layout of the static blocks may therefore be designed beforehand by those responsible for generating the data base. Thus, referring to FIG. 15, after the template is retrieved 1501 from the data base, the layout of the template's static blocks have already been completed. In an embodiment, the phase detector and the lock detect circuit are both implemented as static blocks.

Configurable blocks may then be configured 1502. Configurable blocks are included in the template that was retrieved 1501 from the data base (as described above). However, unlike a static block, the automatic PLL generation software plays a role in defining the final layout information of a configurable block. Generally, configurable aspects of the layout sequence are coextensive with the specific circuit design items that the automatic PLL generation software has determined beforehand. Thus, configurable blocks tend to correspond to those components that the automatic PLL generation routine played a role in determining the design of (while static blocks tend to correspond to those components that the automatic PLL generation routine did not play a role in determining the design of).

For example, recall from the exemplary analog core design methodology 560 discussed above with respect to FIG. 5 that the automatic PLL generation software routine was configured to determine the appropriate charge pump current for the analog PLL core but did not calculate any parameters associated with the design of the phase detector. As a result, the phase detector is implemented as a static block while the charge pump is implemented as a configurable block.

A configurable block, such as the charge pump block discussed just above, frequently has both static and configurable sections. The configurable sections of the configurable block correspond to those sections of the block that are affected by the automatic PLL generation software (e.g., the amount of current that a charge pump pushes/pulls to/from the loop filter).

The static portions of a configurable block correspond to those portions of the block that are not affected by the automatic PLL generation software (e.g., charge pump circuitry responsible for interpreting the phase detector output and enabling, in response, a current source to properly push current to or pull current from the charge pump). Thus, the static portions of a configurable block are not adjusted or tailored by the automatic PLL generation software while the configurable portions are.

Figure 16A:
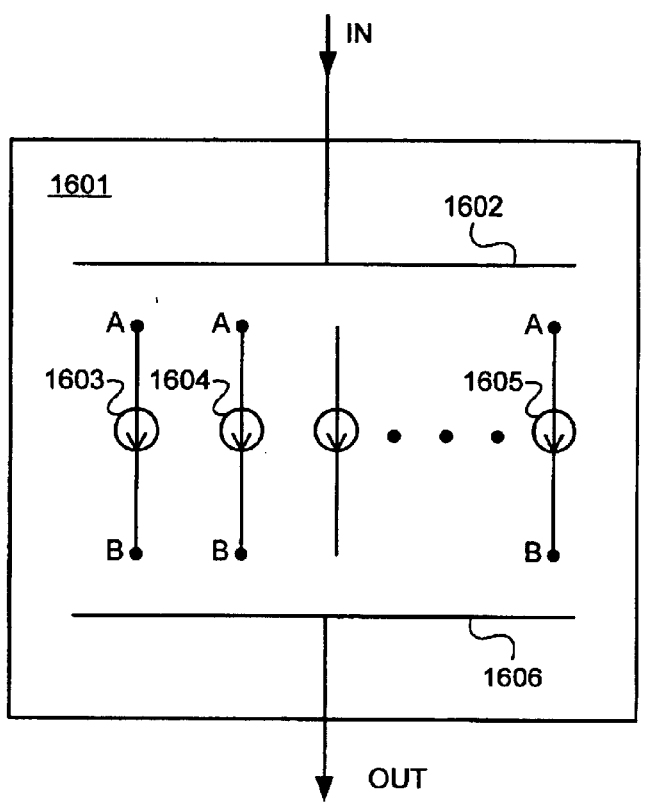
FIG. 16A shows an embodiment of a configurable portion of a charge pump block.

FIG. 16a relates to an approach for implementing a configurable portion of a charge pump block. Recall that the amount of charge pump current may be configured. As such, FIG. 16a shows the portion 1601 of a charge pump design/layout that determines the amount of current pushed (or pulled) to (or from) the loop filter. Other portions of the loop filter design (i.e., the static portions) are not shown for simplicity.

FIG. 16a shows an array of current sources. Note that, as designed into the configurable charge pump block by those responsible for developing the database from which the block was retrieved, the current sources are disconnected from the current flow input node 1601 and the current flow output node 1606. The automatic PLL generation software "connects" the number of current sources needed to produce the amount of current that was determined to be appropriate beforehand (e.g., from methodology 662 of FIG. 6).

For example if each of the current sources in the array are 1 uA current sources and the appropriate amount of charge pump current is 6 uA, the automatic PLL generation software will "connect" 6 current sources to the input node 1601 (e.g., by connecting each of their A terminals to input node 1601) and to the output node 1602 (e.g., by connecting each of their B terminals to output node 1602).

In an embodiment, the configurable block includes enough current sources to provide the maximum charge pump current that the automatic PLL design tool is allowed to configure (e.g., for the target technology employed as established via a look up table such as look up table 602 of FIG. 6 or otherwise). Thus, the template retrieved 1501 from the data base has layout information suitable to configure a maximum charge pump current (should such a charge a pump be designed).

Note that the array of current sources may be partitioned into current source groups of larger and smaller amounts of current. For example, in an embodiment a first partition includes 10 uA current sources, a second partition includes 5 uA current sources and third partition includes 1 uA current sources. As a result, the automatic PLL generation software can configure 16 uA of current by connecting a 10 uA, 5 uA and 1 uA current source to the input node 1602 and output node 1606. Referring back to FIG. 15, when the automatic PLL generation software program makes these connections it is configuring 1502 a configurable charge pump block. The process continues iteratively until each configurable block in the template has been configured.

The following discussion reviews some pertinent aspects of the configurable and static portions of various configurable PLL blocks. With respect to the VCO, recall that the inverter design used within the VCO may be retrieved from a pre-supplied data base that supports the automatic PLL generation program. Likewise, the layout information for each inverter may be stored within and retrieved from a data base as well. As such, the layout of the inverter(s) within a VCO may be viewed as static.

Recall, however that the number of inverters to be used in the VCO was determined by the automatic PLL generation software (e.g., as discussed with respect to methodology 561 of FIG. 5). As such the number of inverters contained in the VCO block are configurable. The automatic PLL generation software therefore builds the VCO block by stringing together in a cascade fashion the proper number of static inverter layout descriptions retrieved from the aforementioned data base. In an embodiment, the region of the template that is reserved for the VCO block is large enough to accommodate the largest number of cascaded inverters that could be designed by the automatic PLL generation tool.

If programmable dividers are used (as a feedback divider in the analog PLL core), the programmable divider is mostly static. That is, for fixed division, the configurable portion of the programmable divider may be limited to the proper value of the input divide word. As such, the automatic PLL generation software may be designed to connect each bit line of the input divide word to a pull up resistor or a pull down resistor so that proper input divide word is hardwired into the divider.

Note that a template for a PLL circuit (an example of which may be envisioned as template 1020 of FIG. 2) may also be used to construct the layout of a PLL circuit. If shift registers are used to implement the dividers and clock waveform shaping circuitry (e.g., as described with respect to FIGS. 11, 12 and 13) the automatic PLL generation software selects the appropriately sized shift register for the designed for division and also hardwires the proper word to be loaded into each shift register. In an embodiment, a PLL circuit template is configured to have a configurable number of openings, each sufficient for the largest sized register that may be used. The automatic PLL generation software then drops an appropriately sized register into each opening for each divided down signal that is needed.

Figure 16B:
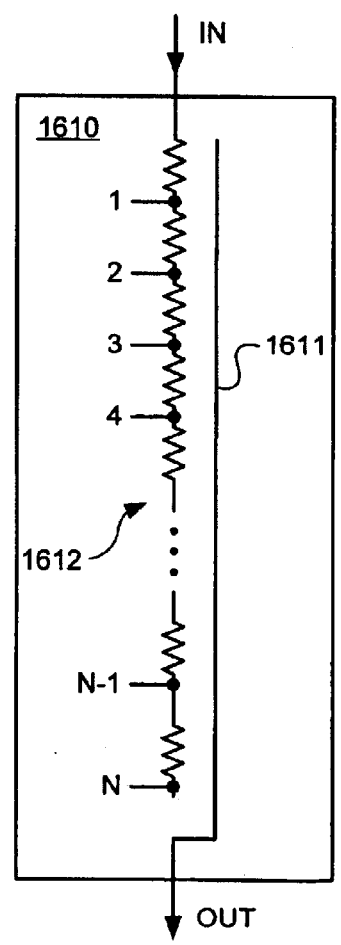
FIG. 16B shows an embodiment of a configurable loop filter resistor.

With respect to the loop filter, recall that the entirety of the loop filter may be designed by the automatic PLL generation circuit (e.g., by the methodology 562 of FIG. 5 where R1, C1 and C2 are determined). As such, the entire loop filter may be viewed as configurable. FIG. 16B shows an embodiment 1610 of an approach that may be used to configure the loop filter resistor R1.

FIG. 16B shows a string of cascaded resistances 1612. The proper loop filter resistance is configured by "tapping" a connection from the string at to the output node 1611. The position of the tapped connection determines the value of the loop resistance. For example, a connection tapped from point "4" corresponds to less resistance than a connection tapped from point "N-1". In an embodiment each discrete resistor is given a value of 100 ohms, thus a 2 K resistor is formed by tapping after the $20^{th}$ resistance. The total resistance of the cascaded resistances 1612 (e.g., the resistance if a connection were tapped from point N) may be designed to be the largest resistance the automatic PLL design tool could design for a loop filter resistor.

The loop filter capacitors are configured by adjusting their size. That is, as is known in the art, the value of a capacitance is a function of its surface area. The automatic PLL generation software determines the appropriate surface area for the capacitor and forms an appropriately sized capacitor. Note that a variable template block size (rather than a fixed template block size) may be used. As such, the automatic PLL generation program adjusts the size of the block for the loop filter capacitors as it forms the PLL core. This is done because the "maximum" capacitance that could be used in a PLL core can be very large. To configure a template with a maximum sized capacitor would consume too much semiconductor surface area.

Once a template has configured all of its configurable blocks, the template has been "completed". A "completed" template may be referred to as a layout tile (such as layout tile 322 of FIG. 3). Note that a PLL circuit template may include a configurable block that corresponds to the analog core.

Additional Comments

It is to be understood that embodiments of this invention may be used as or to support software programs executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A computer-implemented method comprising the steps of:
   a. calculating by means of software a phase lock loop (PLL) voltage controlled oscillator (VCO) output signal frequency in response to a desired output clock frequency;
   b. calculating by means of software a feedback divider ratio for said PLL in response to said VCO output signal frequency; and
   c. generating by means of software a transistor level netlist for an analog PLL core, said analog PLL core having a VCO with said VCO output signal frequency and a feedback divider with said feedback divider ratio.

2. The method of claim 1 further comprising the step of generating by software means, in response to said generated transistor level netlist of said analog PLL core, a layout tile that contains a layout of said analog PLL core.

3. The method of claim 2 wherein said layout tile is within a GDSII format.

4. The method of claim 2 further comprising the step of laying out a semiconductor chip, said semiconductor chip layout including said layout tile.

5. The method of claim 4 further comprising the step of integrating said analog PLL core transistor level netlist into a transistor level netlist of said semiconductor chip.

6. The method of claim 5 further comprising the step of verifying said semiconductor chip layout by comparing connections described in said semiconductor chip layout against connections described in said semiconductor chip transistor level netlist.

7. The method of claim 6 further comprising the step of checking said verified layout for compliance with design rules for a semiconductor chip manufacturing process.

8. The method of claim 7 further comprising the step of generating masks for said semiconductor chip after said verified semiconductor chip layout design rule check is completed.

9. The method of claim 8 further comprising the step of manufacturing a semiconductor chip with said masks.

10. A machine readable medium having stored thereon sequences of instructions which are executable by a digital processing system, and which, when executed by the digital processing system, cause the system to perform a method comprising:
    a. calculating a phase lock loop (PLL) voltage controlled oscillator (VCO) output signal frequency in response to a desired output clock frequency;
    b. calculating a feedback divider ratio for said PLL in response to said VCO output signal frequency; and
    c. generating a transistor level netlist for an analog PLL core, said analog PLL core having a VCO with said VCO output signal frequency and a feedback divider with said feedback divider ratio.

11. A computer-implemented method for automatically generating a design for an analog phase lock loop (PLL) core, said method comprising the steps of:
    calculating by means of software a voltage controlled oscillator (VCO) output signal frequency in response to a desired output clock frequency; and
    generating by means of software a transistor level netlist for an analog PLL core, said analog PLL core having a VCO with said VCO output signal frequency.

12. The method of claim 11 further comprising the step of using said transistor level netlist to generate by means of software a layout tile containing a layout of said analog PLL core in a GDSII format.

* * * * *